(12) United States Patent
Kim et al.

(10) Patent No.: US 8,289,496 B2
(45) Date of Patent: Oct. 16, 2012

(54) SYSTEM AND METHOD FOR TREATING SUBSTRATE

(75) Inventors: Dong Ho Kim, Cheonan-si (KR); Jinyoung Choi, Cheonan-si (KR); Jaeseung Go, Suwon-si (KR); Soomin Hwang, Hwaseong-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 379 days.

(21) Appl. No.: 12/656,425

(22) Filed: Jan. 29, 2010

(65) Prior Publication Data

US 2010/0195066 A1    Aug. 5, 2010

(30) Foreign Application Priority Data

Jan. 30, 2009 (KR) .................. 10-2009-0007626
Mar. 31, 2009 (KR) .................. 10-2009-0027373

(51) Int. Cl.
 G03B 27/32 (2006.01)
 B05C 13/02 (2006.01)
 G03D 5/00 (2006.01)
(52) U.S. Cl. ............... 355/27; 118/58; 396/611
(58) Field of Classification Search .......... 355/27, 355/30, 53; 118/58, 712; 700/100, 112; 396/611
 See application file for complete search history.

(56) References Cited

U.S. PATENT DOCUMENTS

| 7,383,093 B2* | 6/2008 | Higashi et al. ............... 700/100 |
| 2006/0201423 A1 | 9/2006 | Akimoto et al. |
| 2008/0171131 A1* | 7/2008 | Moro et al. ............... 427/8 |
| 2008/0249648 A1* | 10/2008 | Araki ............... 700/112 |

FOREIGN PATENT DOCUMENTS

| CN | 1455438 A | 11/2003 |
| CN | 1655324 A | 8/2005 |
| CN | 1755525 A | 4/2006 |
| CN | 1873537 A | 12/2006 |
| CN | 1933100 A | 3/2007 |
| JP | 08-046010 | 2/1996 |
| JP | 2003-100587 | 4/2003 |
| JP | 2006-019411 | 1/2006 |
| JP | 2007-189139 | 7/2007 |
| JP | 2007-201214 | 8/2007 |
| JP | 2007-335626 | 12/2007 |
| JP | 2009-049053 | 3/2009 |
| KR | 10-0348939 | 7/2001 |
| KR | 10-2005-0004463 | 1/2005 |
| KR | 10-1126865 | 7/2006 |
| KR | 10-2006-0097613 | 9/2006 |
| KR | 10-2006-0135531 | 12/2006 |
| KR | 10-0762522 | 9/2007 |
| KR | 10-0809766 | 2/2008 |
| KR | 2008-0076713 | 8/2008 |

* cited by examiner

*Primary Examiner* — Hung Henry Nguyen

(74) *Attorney, Agent, or Firm* — Harness, Dickey & Pierce, P.L.C.

(57) ABSTRACT

A method and system for treating a substrate are provided. The system includes a coating unit, a pre/post-exposure treatment unit, and a developing unit. Each of the units includes a load port and an index module. The pre/post-exposure treatment unit includes first and second modules that are arranged in different layers. The first module performs a process for coating a protective layer on the wafer before an exposure process. The second module performs a process for cleaning the wafer and a post-exposure bake process after the exposure process.

12 Claims, 18 Drawing Sheets

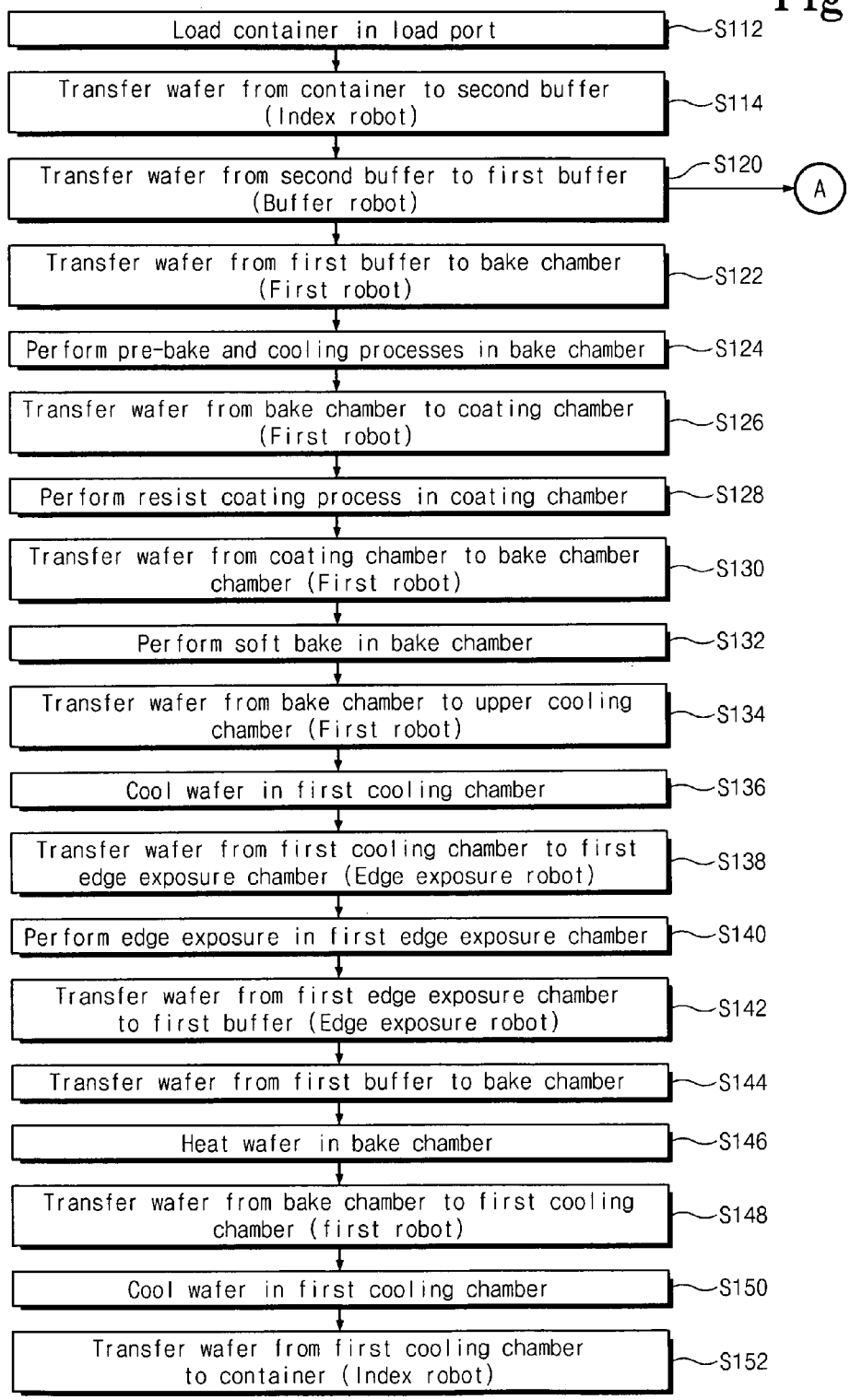

SYSTEM AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2009-0007626, filed on Jan. 30, 2009 and 10-2009-0027373, filed on Mar. 31, 2009, the entire contents of which are hereby incorporated by reference.

BACKGROUND OF THE INVENTION

The present invention disclosed herein relates to a system and method for treating substrates, and more particularly, to a system and method for performing a photolithography process for wafers.

A variety of processes such as a cleaning process, a depositing process, a photolithography process, an etching process, an ion implanting process, etc are performed to manufacture semiconductor devices. The photography process for forming a pattern plays an important role in high integration of the semiconductor devices.

Generally, a system for performing the photolithography process includes a coating unit for coating resist on a wafer, a developing unit for performing a developing process for the wafer that has gone through an exposure process, and a treating module having an interface for inline-connection with an exposure apparatus. In recent years, with the high-integration of the semiconductor devices, the time for performing the exposure process has been increased. This leads to wafer congestion in the exposure apparatus. Therefore, the treating efficiencies in the coating and developing units that are provided in a substrate treating module are significantly deteriorated.

SUMMARY OF THE INVENTION

The present invention provides system and method for treating substrates, which can improve efficiency of a photolithography process.

The present invention also provides system and method for treating substrates, which can increase production efficiency of units for performing coating and developing processes that are respectively preformed before and after an exposure process.

The present invention also provides a substrate treatment system having a layout that can efficiently arrange chambers performing processes.

Objects of the present invention are not limited to those mentioned above, and other objects of the present invention will be apparently understood by those skilled in the art through the following description.

Embodiments of the present invention provide systems for treating a substrate, including: a coating unit performing a coating process for the substrate; a pre/post-exposure treatment unit connected to an exposure unit performing an exposure process and performing a pre/post-exposure treatment process for the substrate that is processed in the coating unit; and a developing unit performing a developing process for the substrate that is processed in the pre/post-exposure treatment unit. Each of the coating unit, pre/post-exposure treatment unit, and the developing unit includes a load port on which a container receiving the substrates is disposed, an index module taking out or carrying the substrate from or to the container, and a process module performing a predetermined process on the substrate. The load port, index module, and process module are sequentially arranged. The pre/post-exposure treatment unit further includes an interface module connected to the exposure unit and the interface module is disposed at one side of the process module and the index module is disposed at the other side of the process module.

In some embodiments, the process module of the pre/post-exposure treatment unit may include first and second modules that are disposed at different layers. The first module may include a protective layer coating chamber coating a protective layer on the substrate; a bake chamber performing a heat treatment for the substrate; and a first robot transferring the substrate between the protective layer coating chamber and the bake chamber. The second module may further include a cleaning chamber cleaning the substrate. In addition, the second module may include a post-exposure bake chamber performing a post-exposure bake chamber for the substrate that is exposed; and a second robot transferring the substrate between the cleaning chamber and the post-exposure bake chamber.

In other embodiments, the pre/post-exposure treatment unit may further include a buffer module disposed between the index module and the process module, wherein the buffer module comprises: a first buffer disposed at a height corresponding to the first module and temporarily storing the substrate; and a second buffer disposed at a height corresponding to the second module and temporarily storing the substrate. The first and second buffers may be stacked one another, and each of the first and second buffers may include a plurality of supports. In addition, the buffer module of the pre/post-exposure treatment unit may further include a buffer robot transferring the substrate between the first and second buffers. The first and second buffers may be arranged side by side in a vertical direction. The buffer module may be disposed at a height corresponding to the first module and further include a cooling chamber cooling the substrate.

In still other embodiments, the interface module may include a first buffer disposed at a height corresponding to the first module and temporarily storing the substrate; a second buffer disposed at a height corresponding to the second module and temporarily storing the substrate; and an interface robot transferring the substrate between the exposure unit and the second buffer and between the second buffer and the exposure unit.

In even other embodiments, the coating unit may further include an edge exposure module, wherein the edge exposure module may be disposed at one side of the process module and the index module may be disposed at the other side of the process module.

In other embodiments of the present invention, pre/post-exposure treatment units for performing processes required before and after an exposure process for a substrate on which photoresist is coated includes a load port on which a container receiving the substrates is disposed; an index module taking out the substrate from the container or carrying the substrate to the container; a process module performing a process for the substrate; and an interface module connected to an exposure unit. The load port, index module, process module, and interface module are sequentially arranged in a first direction and the process module includes a protective layer coating chamber coating a protective layer on the substrate. The process module may further include a cleaning chamber cleaning the substrate. The process module may further include a bake chamber heat-treating the substrate. The process module may further include a post-exposure bake chamber performing a post-exposure bake process for the substrate that is exposed.

In some embodiments, the process module may include first and second modules disposed at different layers, wherein the protective coating chamber may be disposed in the first module and the cleaning chamber may be disposed in the second module. The process module may further include a bake chamber disposed in the first module and heat-treating the substrate; a first robot disposed in the first module and transferring the substrate between the protective layer coating chamber and the bake chamber; a post-exposure bake chamber disposed in the second module and performing a post-exposure bake process for the substrate that is exposed; and a second robot disposed in the second module and transferring the substrate between the cleaning chamber and the post-exposure bake chamber.

In other embodiments, the pre/post-exposure treatment unit may further include a buffer module disposed between the index module and the process module, wherein the buffer module may include a first buffer disposed at a height corresponding to the first module and temporarily storing the substrate; and a second buffer disposed at a height corresponding to the second module and temporarily storing the substrate. The first and second buffers may be stacked one another and each of the first and second buffers may include a plurality of supports on which the substrates are respectively disposed. The buffer module may further include a buffer robot transferring the substrate between the first and second buffers. The first and second buffers may be arranged side by side in a vertical direction. The buffer module may be disposed at a height corresponding to the first module and further include a cooling chamber cooling the substrate.

In still other embodiment, the interface module may include a first buffer disposed at a height corresponding to the first module and temporarily storing the substrate; a second buffer disposed at a height corresponding to the second module and temporarily storing the substrate; and an interface robot transferring the substrate between the first buffer and the exposure unit and between the second buffer and the exposure unit. The first and second buffers may be stacked one another and each of the first and second buffers may include a plurality of supports on which the substrates are respectively disposed.

In still other embodiments of the present invention, pre/post-exposure treatment units for performing processes required before and after an exposure process for a substrate on which photoresist is coated includes a load port on which a container receiving the substrates is disposed; an index module taking out the substrate from the container or carrying the substrate to the container; a process module performing a process for the substrate; a buffer module disposed between the index module and the process module; and an interface module connected to an exposure unit. The load port, index module, buffer module, process module, and interface module are sequentially arranged in a first direction and the process module includes first and second modules disposed at different layers. The first module includes a protective layer coating chamber coating a protective layer on the substrate; a bake chamber heat-treating the substrate; and a return chamber provided with a first robot transferring the substrate between the protective layer coating chamber, bake chamber, buffer module, and interface module. The second module includes a cleaning chamber cleaning the substrate; a post-exposure bake chamber performing a post-exposure bake process for the substrate; and a return chamber provided with a second robot transferring the wafer between the cleaning chamber, post-exposure bake chamber, buffer module, and interface module.

In some embodiments, the protective layer coating chamber, return chamber provided with the first robot, and bake chamber may be sequentially arranged in a second direction, and the cleaning chamber, return chamber provided with the second robot, and post-exposure bake chamber may be sequentially arranged in the second direction.

In other embodiments, the first module may be disposed above the second module. The buffer module may include a first buffer disposed at a height corresponding to the first module and temporarily storing the substrate and a cooling chamber disposed at a height corresponding to the second module and cooling the substrate. The first buffer and the cooling chamber may be arranged side by side in a vertical direction. The first buffer may be arranged inline with the return chamber of the first module in the first direction when viewed from above.

In still other embodiments, the buffer module may further include a second buffer disposed at a height corresponding to the second module and temporarily storing the substrate and a buffer robot transferring the substrate between the first and second buffers. The first buffer and the buffer robot may be arranged in a second direction that is perpendicular to the first direction when viewed from above.

In still other embodiments of the present invention, methods for treating a substrate includes coating photoresist on the substrate; coating a protective layer on the substrate on which the photoresist is coated; performing a liquid immersion lithography process for the substrate on which the protective layer is coated; cleaning the substrate that is processed in the liquid immersion process; and performing a developing process for the substrate. The coating of the protective layer and the cleaning of the substrate are performed in a pre/post-exposure treatment unit connected inline with an exposure unit performing the liquid immersion lithography process. The coating of the photoresist is performed in a coating unit that is separated from the pre/post-exposure treatment unit. The performing of the developing process is realized in a coating unit separated from the pre/post-exposure treatment unit.

In some embodiments, the methods may further include performing a post-exposure bake process for the substrate after cleaning the substrate and before performing the developing process for the substrate. The cleaning of the substrate may be performed by supplying cleaning liquid to the substrate and the cleaning liquid remaining on the substrate may be removed by heating the substrate without drying the substrate by supplying fluid.

The cleaning of the substrate may be performed by supplying cleaning liquid to the substrate, and the cleaning liquid remaining on the substrate may be removed in the post-exposure bake process that is performed immediately after the cleaning of the substrate.

The protect layer may be removed at an outside of the pre/post-exposure treatment unit. A part of the protective layer may be removed in the developing process and the rest may be removed in an ashing process.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 5a to 5b are flowcharts illustrating sequential processes performed in the coating unit of FIG. 2, FIGS. 6 to 8 are schematic views of a post-exposure bake unit according to an exemplary embodiment of the present invention.

DETAILED DESCRIPTION OF PREFERRED EMBODIMENTS

Figure 1:
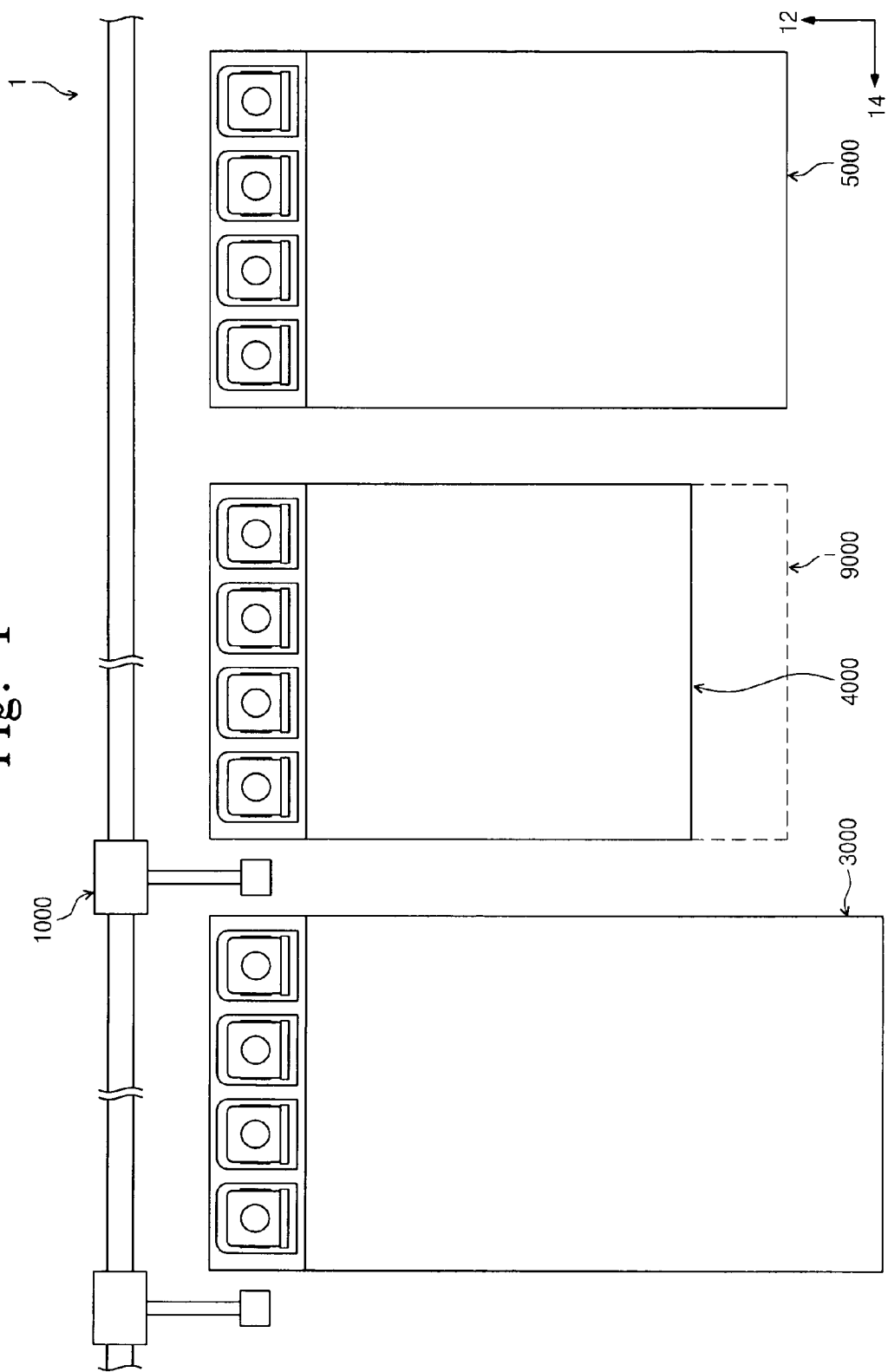
FIG. 1 is a schematic view of a substrate treatment system according to an exemplary embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the dimensions of layers and regions are exaggerated for clarity of illustration.

Systems of exemplary embodiments are used to perform a photolithography process for substrates such as flat display panels or semiconductor wafers. Especially, the systems of the exemplary embodiments are used to perform process for treating the substrates, such as a coating process, a developing process, and other processes that are required before and after a liquid immersion lithography process. In the following description, a case where a wafer is used as the substrate will be described as one example.

FIG. 1 is a schematic view of a substrate treatment system according to an exemplary embodiment of the present invention. Referring to FIG. 1, a substrate treatment system 1 includes a coating unit 300, a pre/post-exposure treatment unit 4000, and a developing unit 5000. The coating unit 3000, the pre/post-exposure treatment unit 4000 are separated from each other. A wafer W is transferred between the coating unit 3000, the pre/post-exposure treatment unit 4000 by an automatic transfer unit 1000 or a worker. The wafer W is transferred in a state where it is received in a container (2000 in FIG. 2). At this point, the container 2000 is structured to be sealed. For instant, a front open unified pod (FOUP) having a front door may be used as the container 2000. In the following description, a case where length directions of the coating unit 3000, pre/post-exposure treatment unit 4000, and developing unit 5000 are arranged side by side with each other will be described. However, the length directions of the coating unit 3000, pre/post-exposure treatment unit 4000, and developing unit 5000 may not be arranged side by side with each other The coating unit 3000 performs a first process for the wafer W. The first process includes a coating process for coating photoresist on the wafer and heat treatment processes for heating and cooling the wafer W before and after the coating process.

The developing unit 5000 performs a second process for the wafer W. The second process includes a developing process for forming a desired pattern by removing the photoresist using a developer and heat treatment processes for heating and cooling the wafer W before and after the developing process.

The pre/post-exposure treatment unit 4000 is connected inline to an exposure unit 9000. The pre/post-exposure treatment unit 4000 performs a third process. The third process includes a process performed between the first process and the exposure process and a process performed between the exposure process and the second process. For example, when the exposure unit performs a liquid immersion lithography process, the third process may include a process for coating a protective layer that protects the photoresist coated on the wafer W during the liquid immersion lithography process. In addition, the third process may include a process for cleaning the wafer after the exposure process. In addition, when chemically amplified resist is used in the coating process and deep ultraviolet (DUV) is used in the exposure process, the third process may include a post-bake process that is performed after the exposure process.

The following will describe the respective units.

(Coating Unit)

Figure 2:
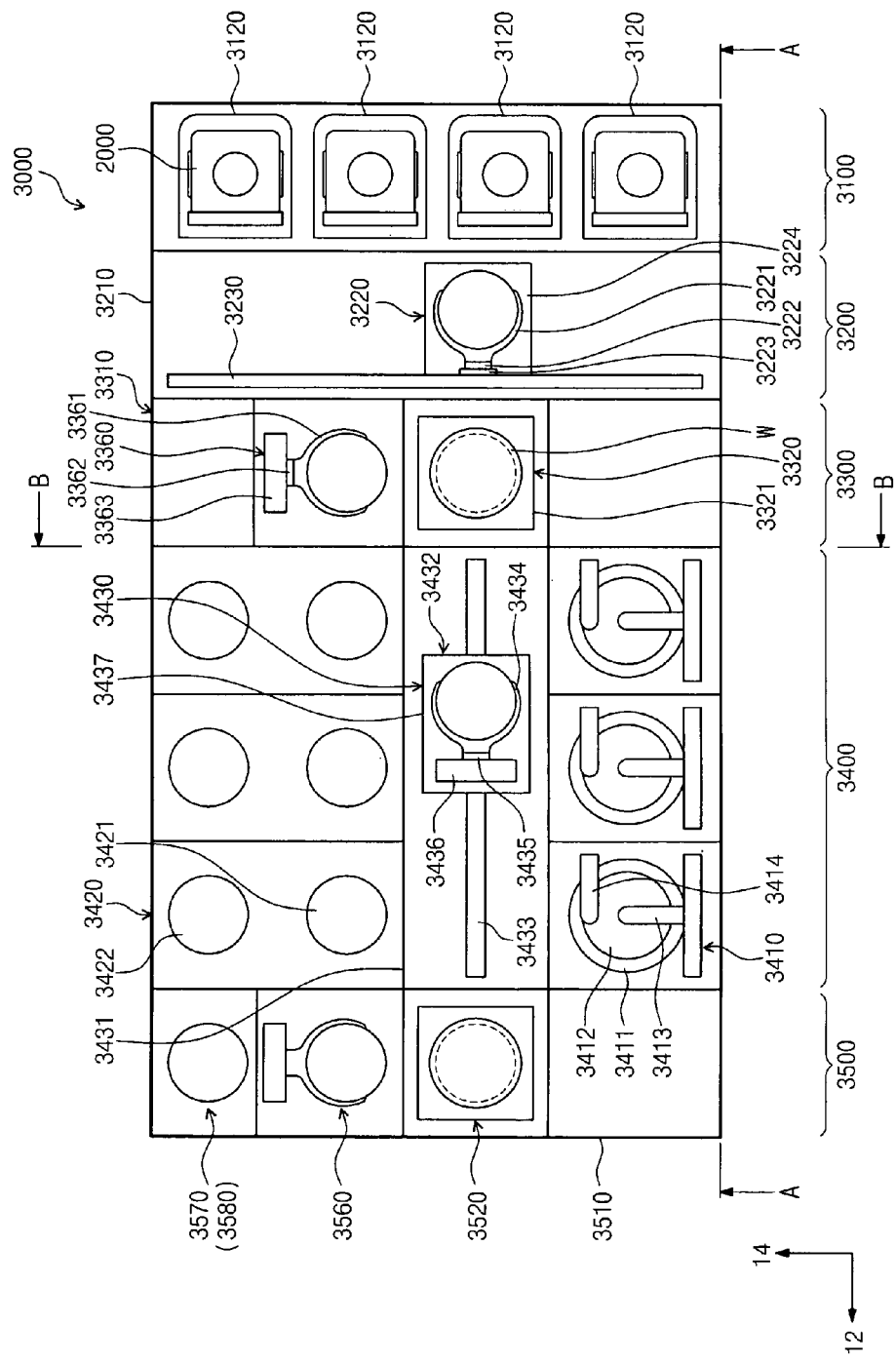
FIGS. 2 to 4 are schematic views of a coating unit according to an exemplary embodiment of the present invention.
Figure 3:
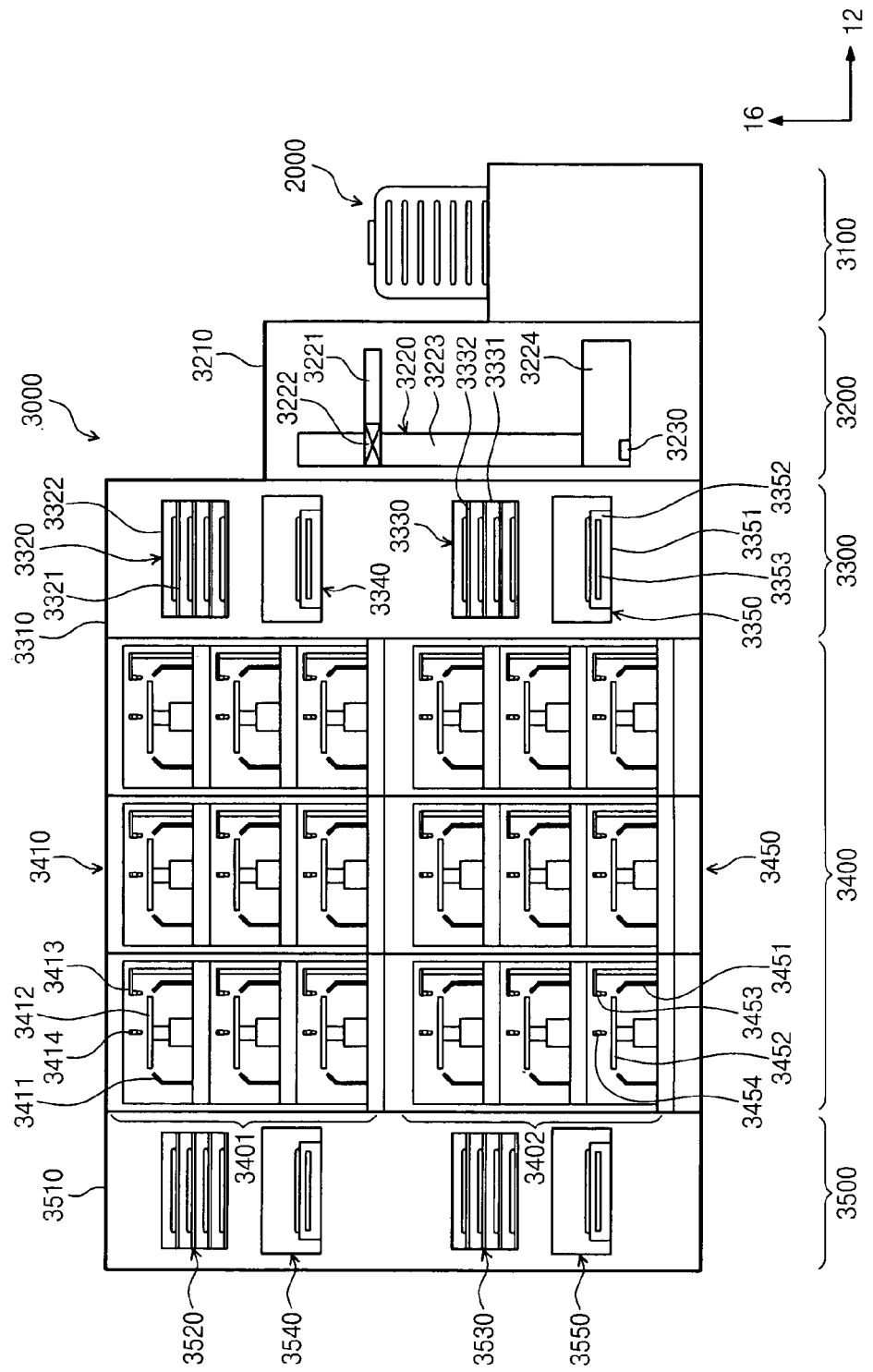
Figure 4:
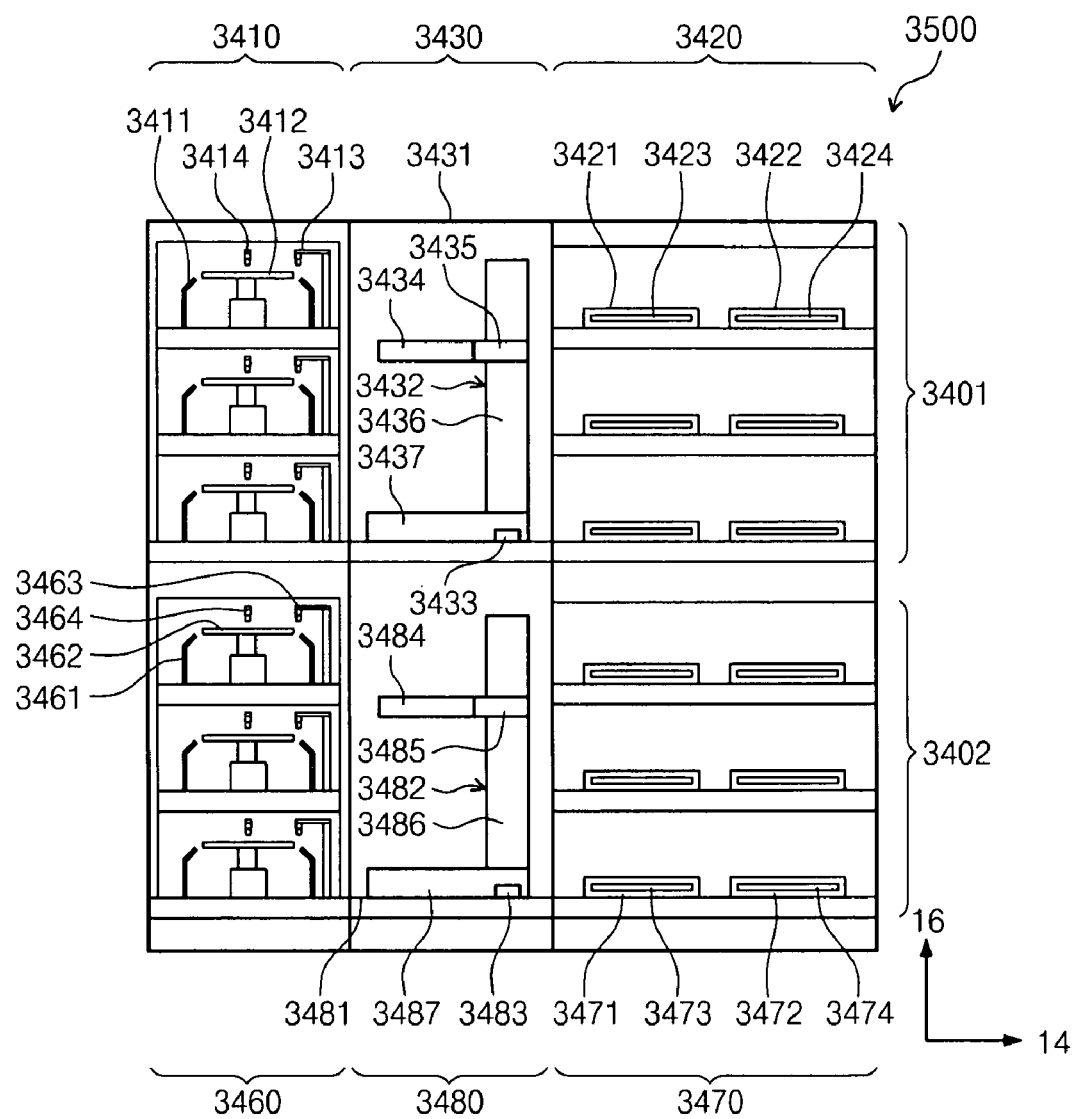

FIGS. 2 to 4 are schematic views illustrating the coating unit 3000. That is, FIG. 2 is a view of the coating unit 3000 when viewed from above, FIG. 3 is a view of the coating unit 3000 of FIG. 2 when viewed in a direction "A," and FIG. 4 is a view of the coating unit 3000 of FIG. 2 when viewed in a direction "B."

Referring to FIGS. 2 to 4, the coating unit 3000 includes a rod port 3100, an index module 3200, a buffer module 3300, a process module 3400, and an edge exposure module 3500. The load port 3100, index module 3200, buffer module 3300, process module 3400, and edge exposure module 3500 are sequentially arranged in a line extending in a direction. Hereinafter, the direction in which the road port 3100, index module 3200, buffer module 3300, process module 3400, and edge exposure module 3500 are arranged will be referred to as "first direction 12," the direction that is perpendicular to the first direction when viewed from above will be referred to as "second direction 14," and the direction that is vertical to the first and second directions 12 and 14 will be referred to as "third direction 16."

The load port 3100 includes a plurality of load tables 3120 on which the containers 2000 receiving the wafers W are disposed. The load tables 3120 are arranged in a line extending in the second direction 14. In FIG. 2, four load tables 3120 are provided.

The index module 3200 transfers the wafer W between the container 2000 on the load table 3120 of the load port 3100 and the buffer module 3300. The index module 3200 includes a frame 3210, an index robot 3220, and a guide rail 3230. The frame 3210 is generally formed in an empty rectangular parallelepiped shape. The frame 3210 is disposed between the load port 3100 and the buffer module 3300. The frame 3210 of the index module 3200 may have the lower height than a frame 3310 of the buffer module 3300, which will be described later. The index robot 3220 and the guide rail 3230 are disposed in the frame 3210. The index robot 3220 has a 4-shaft driving structure such that a hand 3221 directly handling the wafer W can rotate and move in the first, second, and third directions 12, 14, and 16. The index robot 3220 includes an arm 3222, a support 3223, and a base 3224 in addition to the hand 3221. The hand 3221 is fixedly installed on the arm 3222. The arm 3222 is provided to be expandable, contractible, and rotatable. The support 3223 is disposed such that a length direction thereof extends in the third direction 16. The arm 3222 is coupled to the support 3223 to be movable along the support 3223. The support 3223 is fixedly coupled to the base 3224. The guide rail 3230 is provided such that a length direction thereof extends in the second direction 14. The base 3224 is coupled to the guide rail 3230 to be linearly movable along the guide rail 3230. Although not shown in the drawings, the frame 3210 is provided with a door opener for opening and closing the door of the container 2000.

Referring to FIG. 3, the buffer module 3300 includes a frame 3310, a first buffer 3320, a second buffer 3330, a first cooling chamber 3340, a second cooling chamber 3350, and a buffer robot 3360. The frame 3310 is formed in an empty rectangular parallelepiped shape. The frame 3310 is disposed between the index module 3200 and the process module 3400. The first buffer 3320, second buffer 3330, first cooling chamber 3340, second cooling chamber 3350, and buffer robot 3360 are disposed in the frame 3310. The second cooling chamber 3350, second buffer 3330, first cooling chamber 3340, and first buffer 3320 are sequentially arranged upward in the third direction 16. The first cooling chamber 3340 and the first buffer 3320 are located at the same height as a first module 3401 of the process module 3400, which will be described later. The second cooling chamber 3350 and the second buffer 3330 are located at the same height as a second module 3402 of the process module 3400, which will be described later. The buffer robot 3360 is located to be spaced apart from the second buffer 3330, second cooling chamber 3350, first buffer 3320, and first cooling chamber 3340 in the second direction 14 by a predetermined distance.

Each of the first and second buffers 3320 and 3330 temporarily stores a plurality of the wafers W. The second buffer 3330 includes a housing 3331 and a plurality of supports 3332. The supports 3332 are disposed in the housing 3331 and spaced apart from each other in the third direction 16. One wafer W is disposed on each of the supports 3332. The housing 3331 is provided with openings (not shown) corresponding to the index robot 3220, buffer robot 3360, and second robot 3482 such that the index robot 3220, buffer robot 3360, and a second robot 3482 of the second module 3402, which will be described later, can carry or take the wafer to or from the support 3332. The first buffer 3320 has a similar structure to the second buffer 3330. However, the housing 3321 of the first buffer 3320 is provided with openings corresponding to the buffer robot 3360 and a first robot 3432 on the first module 3401, which will be described later. The number of the supports 3322 of the first buffer 3320 may be same as or different from the number of the supports 3332 of the second buffer 3330. For instant, the number of the supports 3332 of the second, buffer 3330 may be greater than the number of the supports 3322 of the first buffer 3320.

The buffer robot 3360 transfers the wafer W between the first and second buffers 3320 and 3330. The buffer robot 3360 includes a hand 3361, an arm 3362, and a support 3363. The hand 3361 is fixedly installed on the arm 3362. The arm 3362 is configured to be capable of expanding and contracting so that the hand 3361 can move in the second direction 14. The arm 3362 is coupled to the support 3363 to be linearly movable along the support 3363 in the third direction 16. The support 3363 has a length extending from a location corresponding to the second buffer 3330 to a location corresponding to the first buffer 3320. The support 3363 may further extend over the location corresponding to the second buffer 3330 or the location corresponding to the first buffer 3320. The buffer robot 3360 may be configured to have a 2-shaft driving structure such that the hand 3361 moves only in the second and third directions 14 and 16.

The first and second cooling chambers 3340 and 3350 cool the wafer W. The second cooling chamber 3350 has a housing 3351 and a cooling plate 3352. The cooling plate 3352 has a top surface on which the wafer W is disposed and a cooling element 3353 cooling the wafer W. The cooling element 3353 may be formed of a variety of elements such as cooling water, a thermoelectric module, and the like. In addition, the second cooling chamber 3350 may be provided with a lift pin assembly (not shown) locating the wafer W on the cooling plate 3352. The housing 3351 is provided with openings (not shown) corresponding to the index robot 3220 and the second robot 3482 so that the index robot 3220 and a second robot 3482 of the second module 3402, which will be described later, can carry or take the wafer W onto or from the cooling plate 3352. In addition, the second cooling chamber 3350 may be provided with doors (not shown) for opening and closing the openings. The first cooling chamber 3340 has the same structure as the second cooling chamber 3350.

The process module 3400 performs a process required before the wafer W is transferred to the pre/post-exposure treatment unit 4000. The process module 3400 is generally formed in a rectangular parallelepiped shape. The process module 3400 includes a first module 3401 and a second module 3402. The first and second modules 3401 and 3402 are arranged at different layers. The first and second modules 3401 and 3402 may be provided to perform a same process. For example, the first module 3401 is located above the second module 3402.

The first module 3401 includes a resist coating chamber 3410, a bake chamber 3420, and a return chamber 3430. The resist coating chamber 3410, bake chamber 3420, and return chamber 3430 are sequentially arranged in the second direction 14. Therefore, the resist coating chamber 3410 and the bake chamber 3420 are spaced apart from each other in the second direction 14 with the return chamber 3430 interposed therebetween. A plurality of the resist coating chambers 3410 are provided in the first and third directions 12 and 16. In the drawings, six resist coating chambers 3410 are exemplarily provided. A plurality of the bake chambers 3420 are provided in each of the first and third directions 12 and 16. In the drawings, six bake chambers 3420 are exemplarily provided. However, six or more bake chambers 3420 may be provided.

The return chambers 3430 are located side by side with the first buffer 3320 of the buffer module 3300 in the first direction 12. The first robot 3432 and the guide rail 3433 are disposed in the return chamber 3430. The return chamber 3430 is generally formed in a rectangular shape. The first robot 3432 transfers the wafer W between the bake chambers 3420, the resist coating chambers 3400, the first buffer 3320 of the buffer module 3300, the first cooling chamber 3340, a first buffer 3520 of the edge exposure module 3500, which will be described later, and the first cooling chamber 3540. The guide rail 3433 has a length direction extending in the first direction 12. The guide rail 3433 guides the linear movement of the first robot 3432 in the first direction 12. The robot 3432 has a hand 3434, an arm 3453, a support 3436, and a base 3437. The hand 3434 is fixedly installed on the arm 3435. The arm 3435 is configured to be capable of expanding and contracting so that the hand 3434 can move in the horizontal direction. The support 3436 is disposed such that a length direction thereof extends in the third direction 16. The arm 3435 is coupled to the support 3436 to be capable of linearly moving along the support 3436 in the third direction 16. The support 3436 is fixedly coupled to the base 3437 and the base 3437 is coupled to the guide rail 3433 to be capable of moving along the guide rail 3433.

All of the resist coating chambers 3410 have a same structure. However, types of the photoresist used in the respective resist coating chambers 3410 may be different from each other. For example, chemically amplified resist may be used as the photoresist. The resist coating chambers 4310 coat the photoresist on the wafers W. The resist coating chamber 3410 includes a housing 3411, a support plate 3412, and a nozzle 3413. The housing 3411 is formed in a cup shape having an opened top. The supporting plate 3412 is located in the housing 3411 to support the wafer W. The supporting plate 3412 is configured to be capable of rotating. The nozzle 3413 supplies the photoresist onto the wafer W on the supporting plate 3412. The nozzle 3413 is formed in a circular tube shape to supply the photoresist to a center of the wafer W. The nozzle 3413 may have a length corresponding to a diameter of the wafer W and have a slit-type outlet. In addition, the resist coating chamber 3410 may further include a nozzle 3414 for supplying cleaning liquid such as deionized water for cleaning a surface of the wafer W on which the photoresist is coated.

The bake chambers 3420 heat-treat the wafers W. For example, the bake chambers 3420 perform a pre-bake process for removing organic matters or moisture from the surfaces of the wafers W by heating the wafers W at a predetermined temperature before coating the photoresist on the wafers W, a soft bake process performed after coating the photoresist on the wafers W. The bake chambers 3420 further perform cooling processes after the respective heating processes. The bake chamber 3420 includes a cooling plate 3421 or a heating plate 3422. The cooling plate 3421 is provided with a cooling element 3423 such as cooling water or thermoelectric module. The heating plate 3422 is provided with a heating element 3424 such as a heating wire or a thermoelectric module. The heating plate 3422 and the cooling plate 3421 may be provided in the respective bake chambers 3420. Alternatively, some of the bake chambers 3420 may be provided with only the heating plate 3422 and the rest may be provided with only the cooling plate 3421.

The second module 3402 includes a resist coating chamber 3460, a bake chamber 3470, and a return chamber 3480. The resist coating chamber 3460, bake chamber 3470, and return chamber 3480 have same structures and arrangements as the resist coating chamber 3410, bake chamber 3420, and return chamber 3430 of the first module 3401. In addition, the return chamber 3480 has a second robot 3482 having the same structure as the first robot 3432 of the first module 3401. The second robot 3482 is configured to transfer the wafer W between the resist coating chamber 3460, bake chamber 3470, second buffer and second cooling chambers 3330 and 3350 of the buffer module 3300, and second buffer 3530 and second cooling chamber 3550 of the edge exposure module 3500, which will be described later.

In the above-described process module 3400, the first and second modules 3401 and 3402 are separated from each other. In addition, when viewed from above, the first module 3401 has the same structure and arrangement as the second module 3402.

The edge exposure module 3500 performs a process for exposing a periphery region of the wafer W. The edge exposure module 3500 includes a frame 3510, a first buffer 3520, a second buffer 3530, a first cooling chamber 3540, a second cooling chamber 3550, an edge exposure robot 3560, a first edge exposure chamber 3570, and a second edge exposure chamber 3580 (disposed under the first edge exposure chamber 3570 in FIG. 2). The frame 3510 is formed in a rectangular shape. The edge exposure chamber 3540, first buffer 3520, first edge exposure chamber 3570, first cooling chamber 3540, second buffer 3530, second edge exposure chamber 3580, and second cooling chamber 3550 are located within the frame 3510. The first buffer 3520, second edge exposure chamber 3570, and first cooling chamber 3540 are arranged at a height corresponding to the first module 3410. The second buffer 3530, second edge exposure chamber 3580, second cooling chamber 3550 are arranged at a height corresponding to the second module 3402. The first buffer 3520, first cooling chamber 3540, second buffer 3530, are second cooling chamber 3550 are sequentially arranged from above along a line extending in the third direction 16. When viewed from above, the first buffer 3520 and the return chamber 3430 of the first module 3401 are arranged along a line extending in the first direction 12. The first edge exposure chamber 3570 is spaced apart from the first buffer 3520 and the first cooling chamber 3540 by a predetermined distance in the second direction 14. The second edge exposure chamber 3580 is spaced apart from the second buffer 3530 and the second cooling chamber 3550 by a predetermined distance in the second direction 14. The second edge exposure chamber 3580 and the first edge exposure chamber 3570 are arranged along a line extending in the third direction 16.

The edge exposure robot 3560 transfers the wafer W between the first buffer 3520, first edge exposure chamber 3570, first cooling chamber 3540, second buffer 3530, second edge exposure chamber 3580, and second cooling chamber 3550. The edge exposure robot 3560 is located between the first edge exposure chamber 3570 and the first buffer 3520. The edge exposure robot 3560 may have the similar structure to the buffer robot 3360.

The first buffer 3520, first cooling chamber 3540, and first edge exposure chamber 3570 perform following processes for the wafers W that are processed in the first module 3401. The first buffer 3520 and second buffer 3560 have the same structure as the first buffer 3320 of the buffer module 3300. The first cooling chamber 3540 cools the wafers W that are processed in the first module 3401. The first cooling chamber 3540 has the similar structure to the first cooling chamber 3340 of the buffer module 3300. The first edge exposure chamber 3570 performs an exposure process for the edges of the wafers W that are cooled in the first cooling chamber 3540. The first buffer 3520 temporarily stores the wafers W before the wafers W that are processed in the first edge exposure chamber 3570 are transferred to the first module 3401.

The second buffer 3530, second cooling chamber 3550, and second edge exposure chamber 3580 perform following processes for the wafers W that are processed in the second module 3402. The second cooling chamber 3550 cools the wafers W that are processed in the second module 3402. The second cooling chamber 3550 has the similar structure to the second cooling chamber 3350 of the buffer module 3300. The second edge exposure chamber 3580 performs an exposure process for the edges of the wafers W that are processed in the second cooling chamber 3550. The second buffer 3530 temporarily stores the wafers W before the wafers W that are processed in the second edge exposure chamber 3580 are transferred to the second module 3402.

Figure 5B:
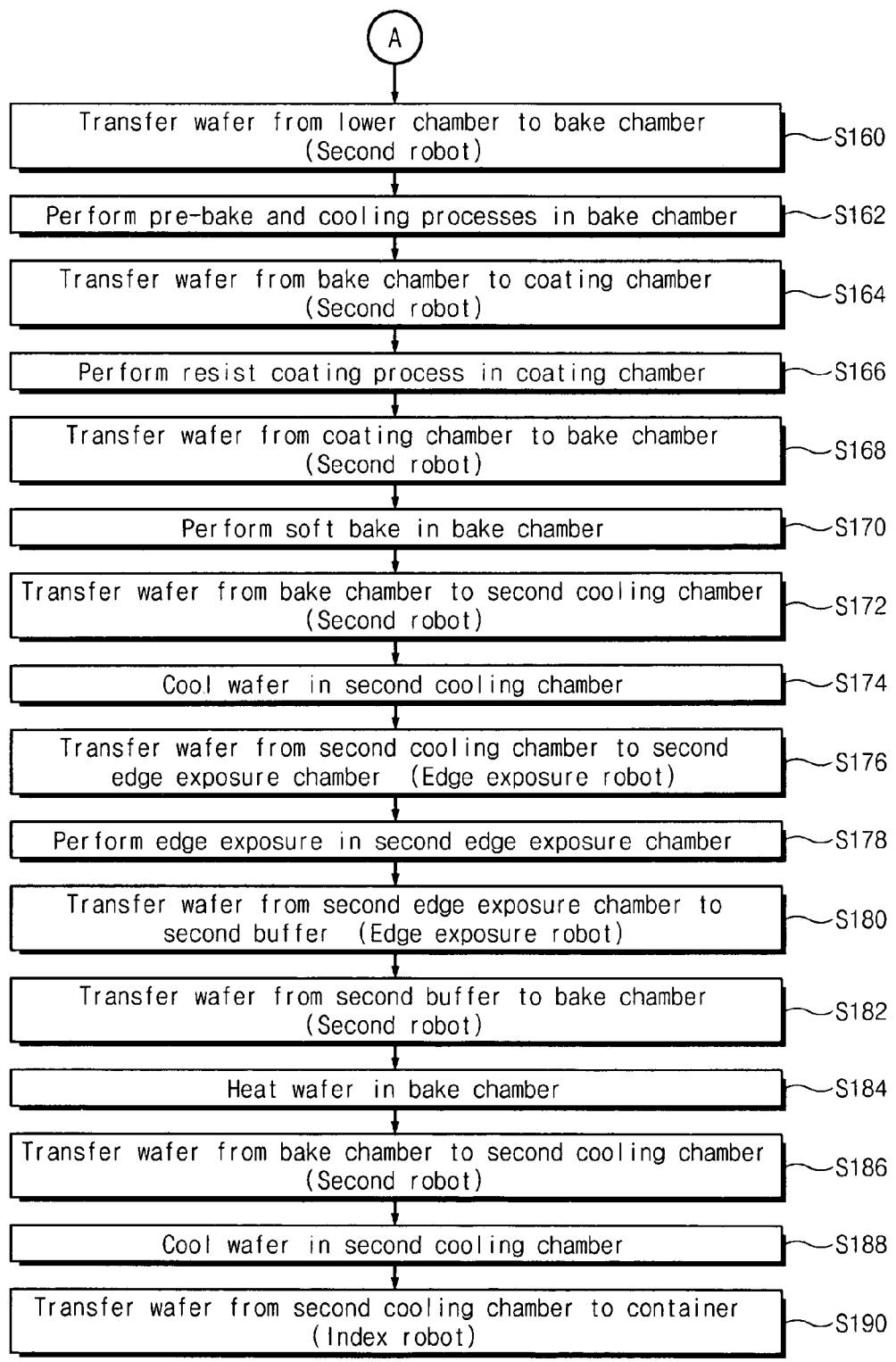

The following will describe the coating process by the coating unit 3000 with reference to FIGS. 5a and 5b. FIGS. 5a and 5b are flowcharts illustrating the process for the wafer in the coating unit 3000 according to an embodiment.

The container 2000 receiving the wafers W is disposed on the load table 3120 of the load port 3100 (S112). The door of the container 2000 is opened by the door opener. The index robot 3220 takes out the wafer W from the container 2000 and carries the same to the second buffer 3330 (S112). The wafer W is transferred to one of the first and second modules 3401 and 3402.

When it is selected that the wafer W is processed in the first module 3401, the buffer robot 3360 carries the wafer W stored in the second buffer 3330 to the first buffer 3320 (S120). The first robot 3432 takes out the wafer W from the first buffer 3320 and carries the same to the bake chamber 3420 (S112). The bake chamber 3420 performs sequentially the pre-bake process and the cooling process (S124). The first robot 3432 takes out the wafer W from the bake chamber 3420 and carries the same to the resist coating chamber 3410 (S126). The resist coating chamber 3410 coats the photoresist onto the wafer W (S128). Next, the first robot 3423 carries the wafer W from the resist coating chamber 3410 to the bake chamber 3420 (S130). The bake chamber 3420 performs the soft bake process for the wafer W (S132).

The first robot 3432 takes out the wafer W from the bake chamber 3420 and carries the same to the first cooling chamber 3540 of the edge exposure module 3500 (S134). The first cooling chamber 3540 performs the cooling process for the wafer W (S136). The cooling process is selectively performed in the bake chamber 3420 and the wafer W may be directly transferred from the bake chamber 3420 to the first buffer 3520. The wafer W that is processed in the first cooling chamber 3540 is transferred to the first edge exposure chamber 3570 by the edge exposure robot 3560 (S138). The wafer W that is processed in the first cooling chamber 3540 may be carried to the first buffer 3520 by the edge exposure robot 3560 and temporarily stored in the first buffer 3520, after which the wafer W may be carried to the first edge exposure chamber 3570 by the edge exposure robot 3560. The first edge exposure chamber 3570 performs the process for exposing the edge of the wafer W (S140). The wafer W that is processed in the first edge exposure chamber 3570 is carried to the first buffer 3520 by the edge exposure robot 3560 (S142).

The first robot 3432 carries the wafer W from the first buffer 3520 to the bake chamber 3420 (S144). The bake chamber 3420 performs a process for heating the wafer W (S146). The first robot 3432 carries the wafer W from the bake chamber 3420 to the first cooling chamber 3340 of the buffer module 3300 (S148). The first cooling chamber 3340 performs the process for cooling the wafer W (S150). The index robot 3220 carries the wafer W from the first cooling chamber 3340 to the container 2000 (S152).

When it is selected that the wafer W is processed in the second module 3402, the second robot 3482 takes out the wafer W from the second buffer 3330 and carries the same to the bake chamber 3470 of the second module 3402 (S160). The bake chamber 3470 sequentially performs the pre-bake process and the cooling process (S162). The second robot 3482 takes out the wafer W from the bake chamber 3470 and carries the same to the resist coating chamber 3460 (S164). The photoresist is coated on the wafer W in the resist coating chamber 3460 (S166). Next, the second robot 3482 carries the wafer W from the resist coating chamber 3460 to the bake chamber 3470 (S168). The bake chamber 3470 performs the soft bake process for the wafer W (S170).

The second robot 3482 takes out the wafer W from the bake chamber 3470 and carries the same to the second cooling chamber 3550 of the edge exposure module 3500 (S172). The second cooling chamber 3550 performs the process for cooling the wafer W. Alternatively, the cooling process may be performed in the bake chamber 3470 and the wafer W may be directly carried from the bake chamber 3470 to the second buffer 3530. The wafer W that is processed in the second cooling chamber 3580 is carried to the second edge exposure chamber 3580 by the edge exposure robot 3560 (S174). The wafer W processed in the second cooling chamber 3550 may be carried to the second buffer 3530 by the edge exposure robot 3560 and temporarily stored in the second buffer 3530, after which the wafer W may be carried to the second edge exposure chamber 3580 by the edge exposure robot 3560 (S176). The second edge exposure chamber 3580 performs the process for exposing the edge of the wafer W (S178). The wafer W processed in the second edge exposure chamber 3580 is carried to the second buffer 3530 by the edge exposure robot 3560 (S180).

The second robot 3482 carries the wafer W from the second buffer 3530 to the bake chamber 3470 (S182). The bake chamber 3470 performs the process for heating the wafer W (S184). The second robot 3482 carries the wafer W from the bake chamber 3470 to the second cooling chamber 3350 of the buffer module 3300 (S186). The second cooling chamber 3350 performs the process for cooling the wafer W (S188). The index robot 3220 carries the wafer W from the second cooling chamber 3350 to the container 2000 (S190).

The following will describe a variety of modified examples of the above-described coating unit 3000.

The process module 3400 may include only one module instead of the first and second modules 3401 and 3402 that are disposed at different layers.

In addition, a plurality of first cooling chambers 3340 and a plurality of second cooling chambers 3350 may be stacked one another in the index module 3200. In addition, a plurality of first cooling chambers 3540 and a plurality of edge exposure chambers 3570 may be provided in the edge exposure module 3500. A plurality of second cooling chambers 3550 and a plurality of second edge exposure chambers 3580 may be also provided in the edge exposure module 3500.

In addition, the first and second cooling chambers 3340 and 3350 may not be provided in the buffer module 3300. In this case, the wafer W may be directly transferred from the first module 3401 to the first buffer 3320 by the first robot 3432 and the index robot 3220 may carry the wafers W stored in the first buffer 3320 to the container 2000. In addition, the wafer W may be directly transferred from the second module 3402 to the second buffer 3330 by the second robot 3482 and the index robot 3220 may carry the wafers W stored in the second buffer 3330 to the container 2000.

Further, the locations of the first buffer 3320 and the first cooling chamber 3340 may be exchanged in the buffer module 3300. The locations of the second buffer 3330 and the second cooling chamber 3350 may be also exchanged in the buffer module 3300.

In addition, the buffer module 3300 may have the same height as the process module 3400. In this case, the index robot 3220 may directly carry the wafers W to the first buffer 3320.

Further, the first cooling chamber 3540 and the second cooling chamber 3550 may not be provided in the edge exposure module 3500. In this case, the wafer W processed in the first module 3401 is directly carried to the first buffer 3520 by the first robot 3432. In addition, the wafer W processed in the second module 3402 is directed carried to the second buffer 3530 by the second robot 3482.

In addition, in the edge exposure module 3500, the locations of the first cooling chamber 3540 and the first buffer 3520 may be exchanged and the locations of the second cooling chamber 3550 and the second buffer 3530 may be exchanged.

Further, the edge exposure module 3500 may include an upper robot (not shown) for transferring the wafer W between the first edge exposure chamber 3570, first buffer 3520, and first cooling chamber 3540 and a lower robot (not shown for transferring the wafer W between the second edge exposure chamber 3580, second buffer 3530, and second cooling chamber 3550 instead of the edge exposure robot 3560.

In addition, the process module 3400 may other processes in addition to the above-described processes.

(Pre/Post-Exposure Treatment Unit)

Figure 6:
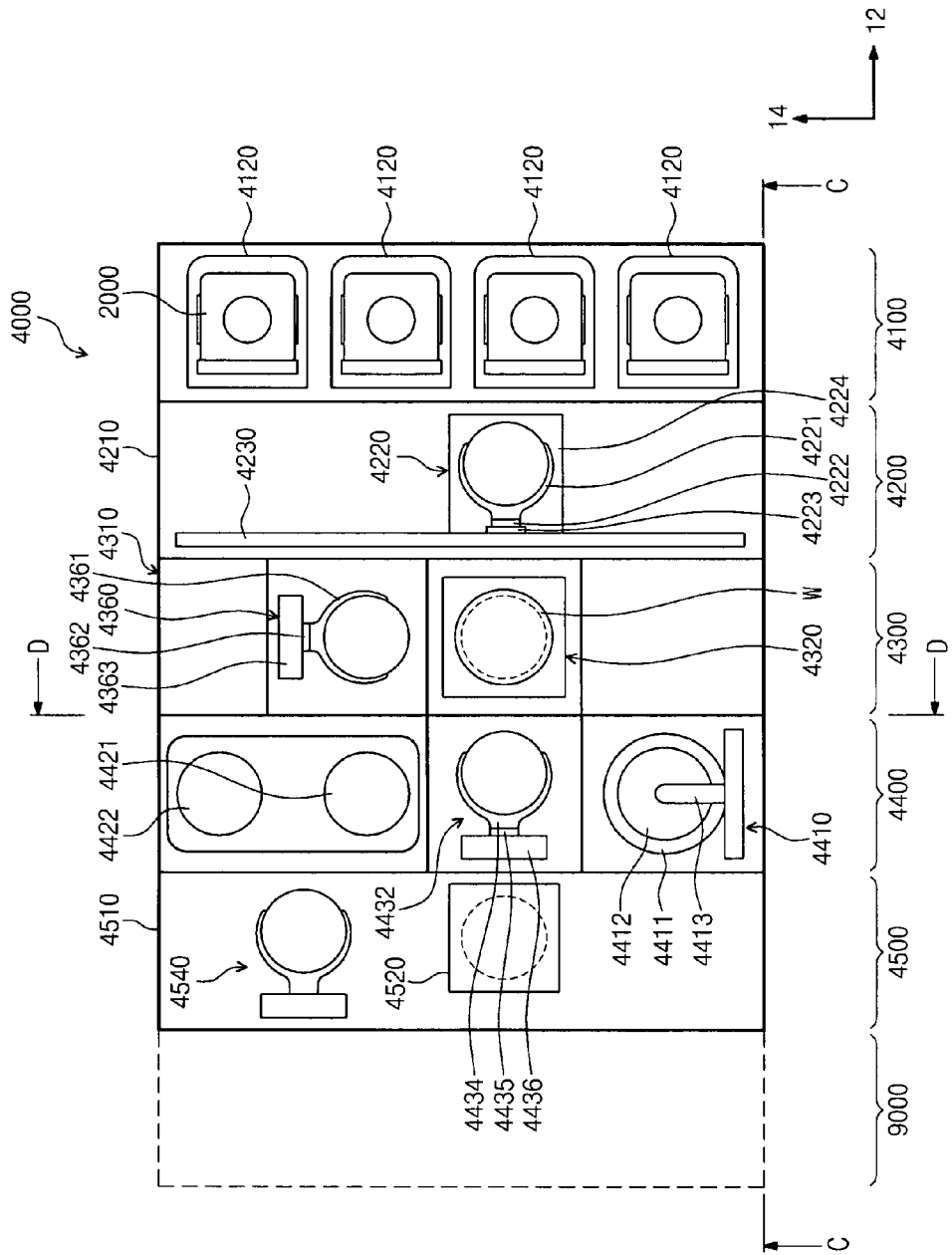
Figure 7:
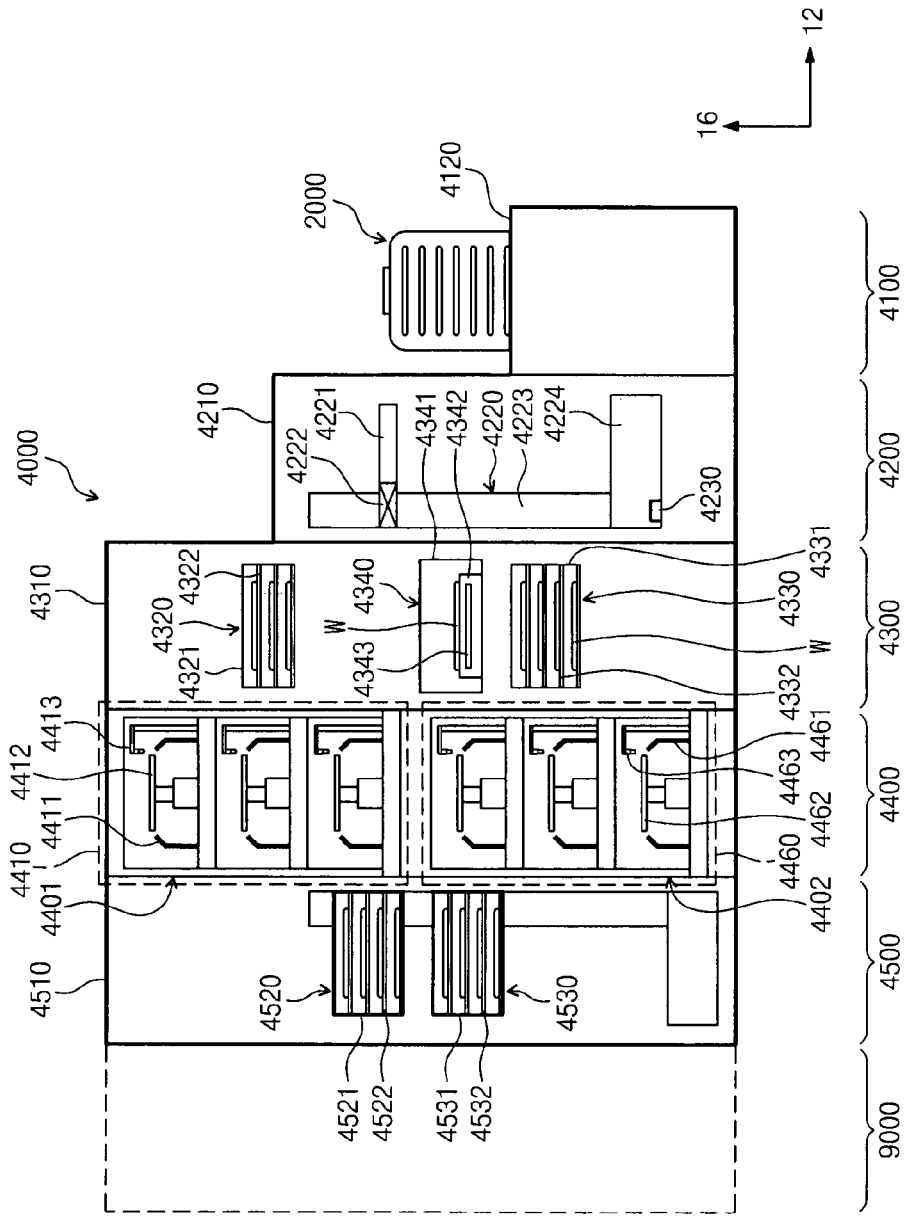
Figure 8:
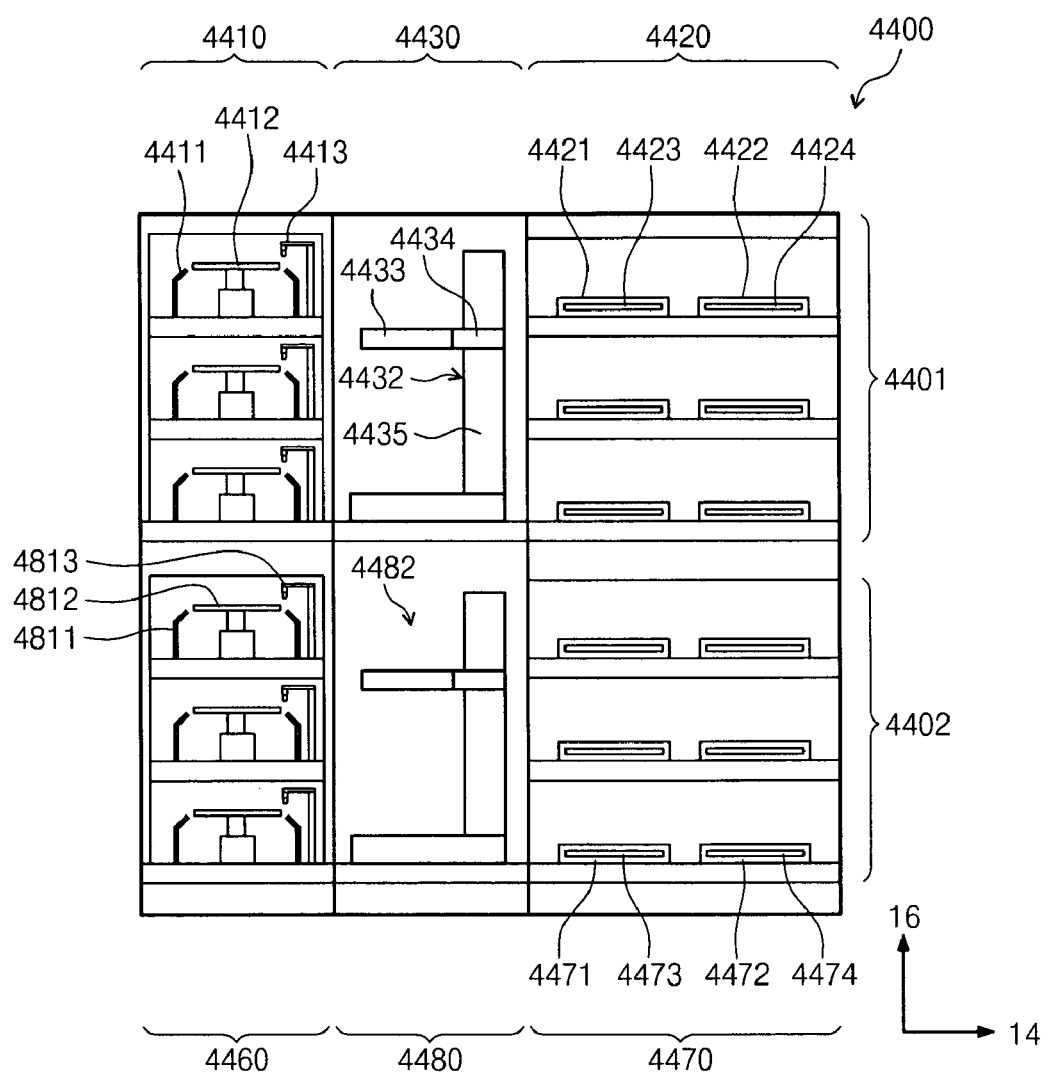

FIGS. 6 to 8 are schematic views of the pre/post-exposure treatment unit 4000. That is, FIG. 6 is a view of the pre/post-exposure treatment unit 4000 when viewed from above, FIG. 7 is a view of the pre/post-exposure treatment unit 4000 of FIG. 6 when viewed in a direction "C," and FIG. 8 is a view of the pre/post-exposure treatment unit 4000 of FIG. 6 when viewed in a direction "D,"

Referring to FIGS. 6 to 8, the pre/post-exposure treatment unit 4000 includes a load port 4100, an index module 4200, a buffer module 4300, a process module 4400, and an interface module 4500. The pre/post-exposure treatment unit 4000 is connected inline with the exposure unit 9000. The exposure unit 9000 is coupled to the interface module 4500 along a line extending in the first direction 12. For example, the exposure unit 9000 performs a process using a liquid immersion lithography technology. In addition, the exposure unit 9000 performs the exposure process using a far-infrared radiation light source such as a KrF excimer laser or a ArF excimer laser.

The load port 4100 includes a load table 4120 on which the container 2000 receiving the wafers W is disposed. A plurality of the load tables 4120 are provided and arranged in a line extending in the second direction 14. In FIG. 6, four load tables 41200 are provided.

The index module 420 transfers the wafers W between the load port 4100 and the container 2000 on the load table 4120. The index module 4200 includes a frame 4210, an index robot 4220, and a guide rail 4230. The frame 4210 is generally formed in an empty rectangular parallelepiped shape. The frame 4210 is disposed between the load port 4100 and the buffer module 4300. The frame 4210 of the index module 4200 may have the lower height than a frame 4310 of the buffer module 4300, which will be described later. The index robot 4220 and the guide rail 4230 are disposed in the frame 4210. The index robot 4220 has a 4-shaft driving structure such that a hand 4221 directly handling the wafer W can move in the first, second, and third directions 12, 14, and 16 and rotate on a horizontal plane. The index robot 4220 includes an arm 4222, a support 4223, and a base 4224 in addition to the hand 4221. The hand 4221 is fixedly installed on the arm 4222. The arm 4222 is provided to be expandable, contractible, and rotatable. The support 4223 is disposed such that a length direction thereof extends in the third direction 16. The arm 4222 is coupled to the support 4223 to be linearly movable along the support 4223 in the third direction 16. The guide rail 4230 is provided such that a length direction thereof extends in the second direction 14. The support 4223 is fixedly coupled to the base 4224. The base 4224 is coupled to the guide rail 4230 to be linearly movable along the guide rail 4230. The frame 4210 is provided with a door opener (not shown) for opening and closing the door of the container 2000.

The buffer module 4300 includes a frame 4310, a first buffer 4320, a second buffer 4330, a cooling chamber 4340, and a buffer robot 4350. The frame 4310 is formed in an empty rectangular parallelepiped shape. The frame 4310 is disposed between the index module 4200 and the process module 4400. The first buffer 4320, second buffer 4330, cooling chamber 4340, and buffer robot 4350 are disposed in the frame 4310. The second buffer 4330, cooling chamber 4340, and first buffer 4320 are sequentially arranged upward in the third direction 16. The first buffer 4320 is located at the same height as a first module 4401 of the process module 4400, which will be described later. The second buffer 4330 and the cooling chamber 4340 are located at the same height as a second module 4402 of the process module 4450, which will be described later. The buffer robot 4350 is located to be spaced apart from the second buffer 4330, cooling chamber 4340, and first buffer 4320 in the second direction 14 by a predetermined distance.

The first and second buffers 4320 and 4330 temporarily store a plurality of the wafers W. The second buffer 4330 includes a housing 4331 and a plurality of supports 4332. The supports 4332 are disposed in the housing 4331 and spaced apart from each other in the third direction 16. One wafer W is disposed on each of the supports 4332. The housing 4331 is provided with openings (not shown) corresponding to the index robot 4220 and buffer robot 4350 such that the index robot 4220 and buffer robot 4360 can carry or take the wafer to or from the support 4332. The first buffer 4320 has a similar structure to the second buffer 4330. However, the housing 4321 of the first buffer 4320 is provided with openings corresponding to the buffer robot 4350 and a first robot 4432 of the first module 4401, which will be described later. The number of the supports 4322 of the first buffer 4320 may be same as or different from the number of the supports 4332 of the second buffer 4330.

The buffer robot 4350 transfers the wafer W between the first and second buffers 4320 and 4330. The buffer robot 4350 includes a hand 4361, an arm 4362, and a support 4363. The hand 4361 is fixedly installed on the arm 4362. The arm 4362 is configured to be capable of expanding and contracting so that the hand 4361 can move in the horizontal direction. The arm 4362 is coupled to the support 4363 to be linearly movable along the support 4363 in the third direction 16. The support 4363 has a length extending from a location corresponding to the second buffer 4330 to a location corresponding to the first buffer 4320. The support 4363 may further extend over the location corresponding to the second buffer 4330 or the location corresponding to the first buffer 4320. The buffer robot 4350 may be configured to have a 2-shaft driving structure such that the hand 3361 moves only in the second and third directions 14 and 16.

The cooling chamber 4340 cools the wafer W. The cooling chamber 4340 includes a housing 4341 and a cooling plate 4342. The cooling plate 4342 has a top surface on which the wafer W is disposed and a cooling element 4343 for cooling the wafer W. A variety of elements such as cooling water, a thermoelectric module, or the like may be used as the cooling element 4343. In addition, the cooling chamber 4340 may be provided with a lift pin assembly (not shown) for locating the wafer W on the cooling plate 4342. The housing 4341 is provided with openings (not shown) corresponding to the index robot 4220 and the buffer robot 4350 so that the index robot 4220 and a second robot 4482 of the second module 4402, which will be described later, can carry or take the wafer W onto or from the cooling plate 4342. In addition, the cooling chamber 4340 may be provided with doors (not shown) for opening and closing the openings.

The process module 4400 includes a first module 4401 and a second module 4402. The first module 4401 performs a process for treating the wafer W before the exposure process and the second module 4402 performs a process for treating the wafer W after the exposure process. The first and second modules 4401 and 4402 are disposed at different layers. For example, the first module 4401 is located above the second module 4402. The first module 4401 includes a protective layer coating chamber 4410, a bake chamber 4420, and a return chamber 4430. The protective layer coating chamber 4410, bake chamber 4420, and return chamber 4430 are sequentially arranged in the second direction 14. Accordingly, the protective layer coating chamber 4410 and the bake chamber 4420 are spaced apart from each other with the return chamber 4430 interposed therebetween. A plurality of the protective layer coating chamber 4410 are provided and arranged at different layers in the third direction 16. Alternatively, a plurality of the protective layer coating chambers 4410 may be provided in the first and third directions 12 and 16. A plurality of the bake chambers 4420 are provided at different layers in the third direction 16. Alternatively, the bake chambers 4420 may be arranged in the first and third directions 12 and 16.

The return chamber 4430 is arranged side by side with the first buffer 4320 of the buffer module 4300 in the first direction 12. The first robot 4432 is located within the return chamber 4430. The return chamber 4430 is generally formed in a square shape or a rectangular Shape. The first robot 4432 transfers the wafers W between the bake chambers 4420, protective coating chambers 4410, first buffer 4320 of the buffer module 4300, and a first buffer 4520 of the interface module 4500, which will be described later. The first robot 4432 includes a hand 4433, an arm 4434, and a support 4435. The hand 4433 is fixedly installed on the arm 4434. The arm 4434 is structured to be capable of expanding, contracting, and rotating. The arm 4434 is coupled to the support 4435 to be linearly movable along the support 4435 in the third direction 16.

The protective layer coating chamber 4410 coats a protective layer on the wafer W to protect the resist layer during the liquid immersion lithography process. The protective layer coating chamber 4410 includes a housing 4411, a support plate 4412, and a nozzle 4413. The housing 4411 is formed in a cup shape having an opened top. The support plate 4412 is located within the housing 4411 and supports the wafer W. The support plate 4412 is rotatably provided. The nozzle 4413 supplies protective liquid for forming the protective layer onto the wafer W on the support plate 4412. The nozzle 4413 is formed in a circular tube shape and supplies the protective liquid to the center of the wafer W. Alternatively, the nozzle 4413 may have a length equal to the diameter of the wafer W and may be provided at an outlet thereof with a slit. In this case, the support plate 4412 may be provided in a fixed state. The protective liquid includes a foaming material. The protective liquid may be a material that has a low affinity with the photoresist and fire. For example, the protective liquid may include a fluorine-based solvent. The coating of the protective liquid by the protective layer coating chamber 4410 starts from the central region of the wafer W while the wafer W on the support plate 4412 rotates.

The bake chamber 4420 heat-treats the wafer W on which the protective layer is coated. The bake chamber 4420 has at least one of a cooling plate 4421 and a heating plate 4422. The cooling plate 4421 is provided with a cooling element 4423 such as cooling water or a thermoelectric module. The heating plate 4422 is provided with a heating element 4424 such as a heating wire or a thermoelectric module. Each of the heating plate 4422 and the cooling plate 4421 may be provided in one bake chamber 4420. Alternatively, some of the bake chambers 4420 may have only the heating plate 4422 and the rest may have only the cooling plate 4421. The second module 4402 includes a cleaning chamber 4460, a post-exposure bake chamber 4470, and a return chamber 4480. The cleaning chamber 4460, return chamber 4480, and post-exposure bake chamber 4470 are sequentially arranged along a line extending in the second direction 14. Therefore, the cleaning chamber 4460 and the post-exposure bake chamber 4470 are spaced apart from each other in the second direction 14 with the return chamber 4480 interposed therebetween. A plurality of the cleaning chambers 4460 are provided and disposed at different layers in the third direction 16. Alternatively, a plurality of the cleaning chambers 4460 may be arranged in each of the first and second directions 12 and 16. A plurality of the post-exposure bake chambers 4470 are provided and disposed at different layers along a line extending in the third direction 16. Alternatively, a plurality of the post-exposure bake chambers 4470 may be arranged in each of the first and third directions 12 and 13.

The return chamber 4480 is arranged side by side with the second buffer 4330 of the buffer module 4300 in the first direction 12. The return chamber 4480 is generally formed in a square shape or a rectangular shape. The second robot 4482 is located within the return chamber 4480. The second robot 4482 is configured to transfer the wafer W between the post-exposure bake chambers 4470, cleaning chambers 4460, buffer module 4300, cooling chamber 4340, and a second buffer 4530 of the interface module 4500, which will be described later. The second robot 4482 provided in the second module 4402 may have the same structure as the first robot 4432 of the first module 4401.

The cleaning chamber 4460 cleans the wafer W after the exposure process. The cleaning chamber 4460 includes a housing 4461, a support plate 4462, and a nozzle 4463. The housing 4461 is formed in a cup shape having an opened top. The support plate 4462 is located within the housing 4461 and supports the wafer W. The support plate 4462 is rotatably provided. The nozzle 4463 supplies cleaning liquid to the wafer W on the support plate 4462. The cleaning liquid may be water such as deionized water. The cleaning chamber 4460 supplies the cleaning liquid to the central region of the wafer W while rotating the wafer W on the support plate 4462. As the wafer W rotates, the nozzle 4463 may linearly move or rotate from the central region to the peripheral region of the wafer W.

The post-exposure bake chamber 4470 heats the wafer W that is treated in the exposure process using deep ultraviolet. The post-exposure bake process completes a property variation by amplifying acid, which is generated by exposing the photoresist, by heating the wafer W. The post-exposure bake chamber 4470 has a heating plate 4472. The heating plate 4472 is provided with a heating element 4472 such as a heating wire or a thermoelectric module. The post-exposure chamber 4470 may further include a cooling plate 4471. The cooling plate 4471 is provided with a cooling element 4473 such as cooling water and a thermoelectric module. Alternatively, a bake chamber having only the cooling plate 4471 may be further provided.

As described above, the first and second modules 4401 and 4402 are completely separated from each other in the process module 4400. In addition, the return chamber 4430 of the first module 4401 has the same size as the return chamber 4480 of the second module 4402 so that they can completely overlap with each other when viewed from above. In addition, the protective layer coating chamber 4410 has the same size as the cleaning chamber 4460 so that the protective layer coating chamber 4410 and the cleaning chamber 4460 completely overlap with each other when viewed from above. Further, the bake chamber 4420 has the same size as the post-exposure bake chamber 4470 so that they completely overlap with each other when viewed from above.

The interface module 4500 transfers the wafer W between the process module 4400 and the exposure unit 9000. The interface module 4500 includes a frame 4510, a first buffer 4520, a second buffer 4530, and an interface robot 4540. The interface robot 4540, first buffer 4520, and second buffer 4530 are located within the frame 4510. The first and second buffers 4520 and 4530 are spaced apart from each other and stacked one another. The first buffer 4520 is disposed above the second buffer 4530. The first buffer 4520 is disposed at a height corresponding to the first module 4401. The second buffer 4530 is disposed at a height corresponding to the second module 4402. When viewed from above, the first buffer 4520 is arranged inline with the return chamber 4430 of the first module 4401 in the first direction 12. The second buffer 4530 is arranged inline with the return chamber 4430 of the second module 4402 in the first direction 12. The interface robot 4540 is spaced apart from the first and second buffers 4520 and 4530 in the second direction 14. The interface robot 4540 transfers the wafer W between the first buffer 4520, second buffer 4530, and exposure unit 9000. The interface robot 4540 has a similar structure to the buffer robot 4530.

The first buffer 4520 temporarily stores the wafers W that are processed in the first module 4401 before the wafers W are transferred to the exposure unit 9000. The second buffer 4530 temporarily stores the wafers W that are processed in the exposure unit 9000 before the wafers W are transferred to the second module 4402. The first buffer 4520 has a housing 4521 and a plurality of supports 4522. The supports 4522 are disposed within the housing 4521 and spaced apart from each other in the third direction 16. One wafer W is disposed on each of the supports 4522. The housing 4521 is provided with openings respectively corresponding to the interface robot 4540 and the first robot 4432 so that the interface robot 4540 and the first robot 4432 can carry and take out the wafer W to and from the supports 4522 in the housing 4521. The second buffer 4530 has a similar structure to the first buffer 4520. However, the housing 4531 of the second buffer 4530 is provided with openings (not shown) respectively corresponding to the interface robot 4540 and the second robot 4482. The number of the supports 4522 of the first buffer 4520 may be same as or different from that of the supports 4532 of the second buffer 4530.

Figure 9:
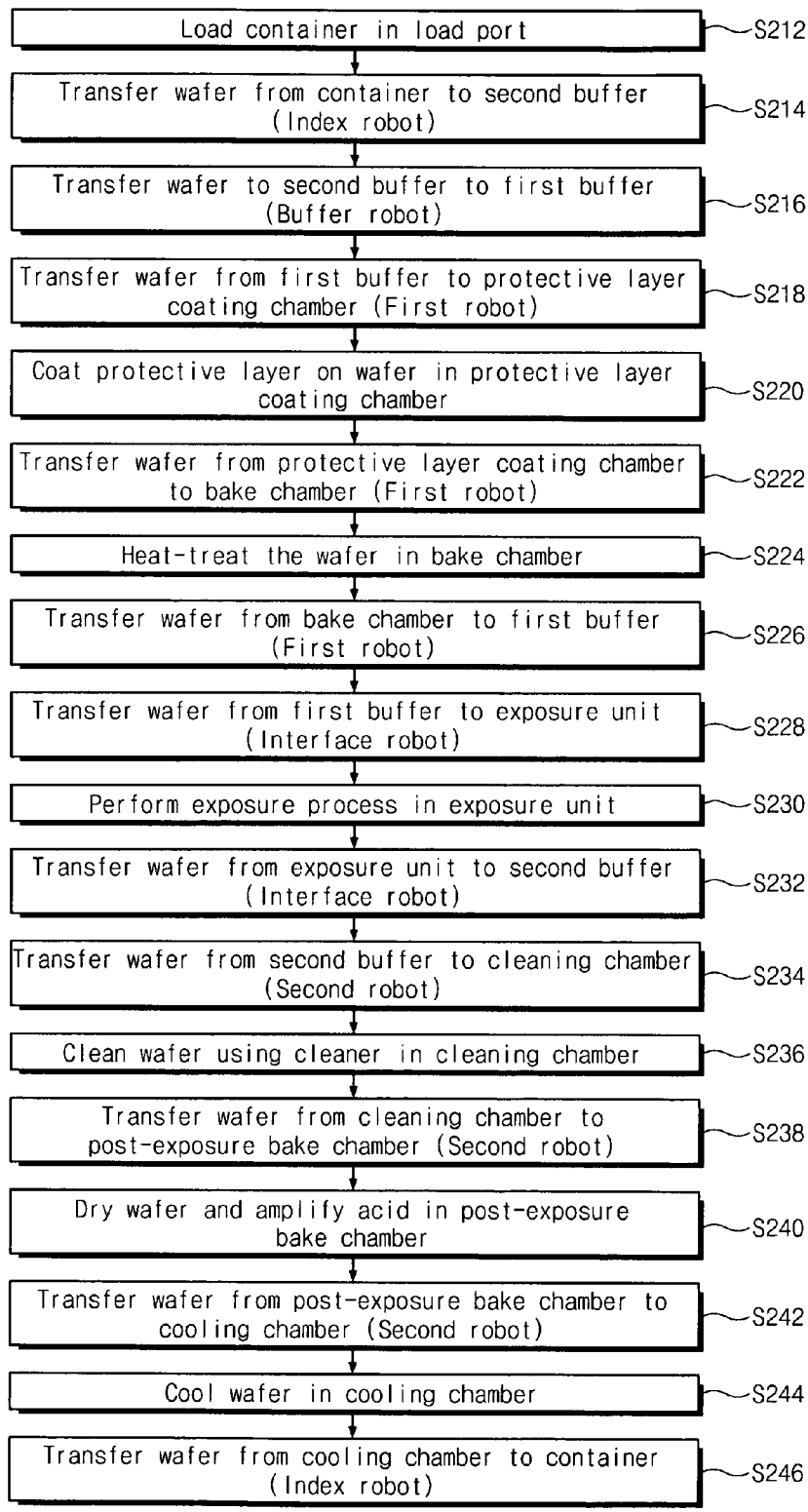
FIG. 9 is a flowchart illustrating sequential processes performed in the coating unit of FIG. 6, FIGS. 10 to 12 are schematic views of a developing unit according to an exemplary embodiment of the present invention.

The following will describe a process performed by the pre/post-exposure treatment unit 4000 according to one embodiment with reference to FIG. 9. FIG. 9 is a flowchart illustrating a process for the wafer W by the pre/post-exposure treatment unit 4000 according to one embodiment. In FIG. 5, a case where the chemically amplified resist is coated on the wafer W and the exposure unit 9000 performs the exposure process and liquid immersion lithography using deep ultraviolet light source will be exemplarily described.

The wafers W that are processed in the coating unit 3000 are loaded in the container 2000. The container 2000 is disposed on the load table 4120 of the pre/post-exposure treatment unit 400 (S212). The door is opened by the door opener (not shown). The index robot 4220 takes out the wafer W from the container 2000 and carries the same to the second buffer 4330 of the buffer module 4300 (S214). The buffer robot 4350 carries the wafer W stored in the second buffer 4330 to the first buffer 4320 (S216). The first robot 4432 takes out the wafer from the first buffer 4320 and carries the same to the protective layer coating chamber 4410 of the process module 4400 (S218). The protective layer coating chamber 4410 coats the protective layer on the wafer W (S220). Next, the first robot 4432 transfers the wafer W from the protective layer coating chamber 4410 to the bake chamber 4420 (S222). The bake chamber 4420 performs a heat treatment such as heating and cooling for the wafer W (S224).

The first robot 4432 takes out the wafer W from the bake chamber 4420 and carries the same to the first buffer 4520 (S226). The interface robot 4540 carries the wafer W from the first buffer 4520 to the exposure unit 9000 (S228). The exposure process for the wafer W is performed in the exposure unit 9000 (S230). Next, the interface robot 4540 carries the wafer W from the exposure unit 9000 to the second buffer 4530 (S232).

The second robot 4482 takes out the wafer W from the support of the second buffer 4530 and carries the same to the cleaning chamber 4460 of the process module 4400 (S234). The cleaning chamber 4460 supplies cleaning liquid to a surface of the wafer W to perform the cleaning process (S236). When the cleaning of the wafer W by the cleaning liquid is completed, the second robot 4482 immediately takes out the wafer W from the cleaning chamber 4460 and carries the same to the post-exposure bake chamber 4470 (S238). The cleaning liquid adhered to the wafer W is removed by heating the wafer W on the heat plate of the post-exposure bake chamber 4470 and, at the same time, the acid generated in the photoresist is amplified to complete the property variation of the photoresist (S240).

The second robot 4482 carries the wafer W from the post-exposure bake chamber 4470 to the cooling chamber 4340 of the buffer module 4300 (S242). The cooling of the wafer W is performed in the cooling chamber 4340 (S244). The index robot 4220 takes out the wafer W from the cooling chamber 4340 and carries the same to the container 2000 (S246).

The container 2000 is carried to the developing unit 5000 and the developing process is performed in the developing unit 5000.

Some of the protective layer remaining on the wafer W is removed by a developing solution and the rest is removed together with the photoresist during an ashing process.

According to an embodiment of FIG. 6, no protective layer removal chamber is provided in the pre/post-exposure treatment unit 4000. Therefore, the structure of the pre/post-exposure treatment unit 4000 is relatively simple and the time for performing the process can be reduced.

In addition, when the chemically amplified resist is used, the timing for performing the post-exposure baking process after the exposure process is performed is important. According to the embodiment of FIG. 6, the post-exposure bake chamber 4470 is provided to the pre/post-exposure treatment unit 4000. Accordingly, the amplifying of the acid in the pre/post-exposure treatment unit 4000 can be quickly realized before the wafer W is transferred to the developing unit 5000.

Further, according to the embodiment of FIG. 6, the cleaning chamber 4460 performs only the cleaning process for the wafer W using the cleaning liquid. That is, the cleaning chamber 4460 does not perform the drying process for the wafer W using drying gas. The drying of the wafer W is performed by heating the wafer W. For example, the drying of the wafer W is performed simultaneously with the acid amplification in the post-exposure bake chamber 4470. Accordingly, the process time can be reduced as compared with a case where the cleaning and drying of the wafer are preformed in the cleaning chamber 4460.

The following will describe a variety of modified examples of the pre/post-exposure treatment unit 4000.

In the above-described embodiment, it is described that the first module 4401 is disposed above the second module 4402. However, the second module 4402 may be disposed above the first module 4401.

In addition, the process module 4400 may include only one module instead of the first and second modules 4401 and 4402 that are disposed at different layers. In this case, all of the protective layer coating chamber 4410, bake chamber 4420, cleaning chamber 4460, and post-exposure bake chamber 4470 may be provided in the module.

In addition, the cleaning chamber 4460 may further includes a nozzle for supplying drying gas in addition to the nozzle for supplying the cleaning liquid. In this case, the cleaning liquid adhered to the wafer W can be removed before the wafer W is heated in the post-exposure bake chamber 4470.

Further, no cooling plate may be provided in the second module 4402. The cooling of the wafer W may be realized only in the cooling chamber 4340 of the buffer module 4300. In this case, a plurality of the cooling chambers 4340 may be disposed in the buffer module 4300 and stacked one another.

In addition, no cooling chamber 4340 may be provided in the buffer module 4300. In this case, the wafer W that is cooled in the second module 4402 is directly transferred to the second buffer 4330 by the second robot 4482 and the index robot 4220 transfers the wafer W stored in the second buffer 4330 to the container 2000.

Further, the locations of the cooling chamber 4340 and the second buffer 4330 in the buffer module 4300 may be exchanged.

In addition, the locations of the first and second modules 4401 and 4402 may be exchanged. In this case, the cooling unit in the buffer module 4300 may be selectively provided at a height corresponding to the second module 4402.

Further, the buffer module 4300 may have the same height as the process module 4400. In this case, the index robot 4220 may directly transfer the wafer to the first buffer 4320.

In addition, a protective layer removal chamber for removing the protective layer after the exposure process may be provided in the second module 4402. In this case, the protective layer on the wafer W can be removed before the etching process.

Further, when the exposure unit 9000 performs a process using a method other than the liquid immersion lithography method, no protective layer coating unit 3000 may provided in the first module 4401. In this case, no bake chamber 4420 may be also provided. In this case, the process module 4400 may include only the second module 4402 without the first module 4401.

In addition, when the exposure unit 9000 uses a light source other than the deep ultraviolet light source, no post-exposure bake chamber 4470 may be provided in the second module 4402.

(Developing Unit)

Figure 10:
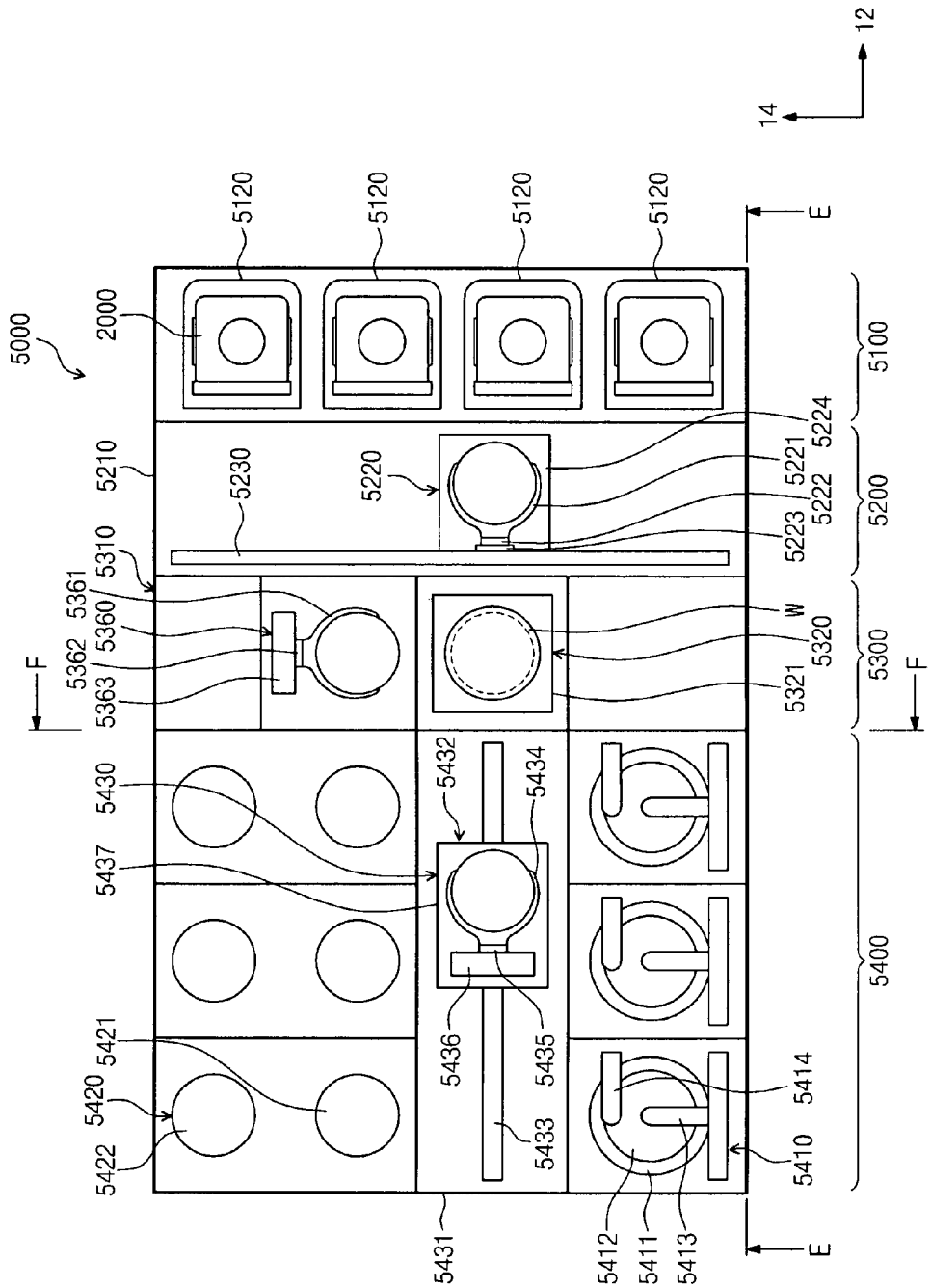
Figure 11:
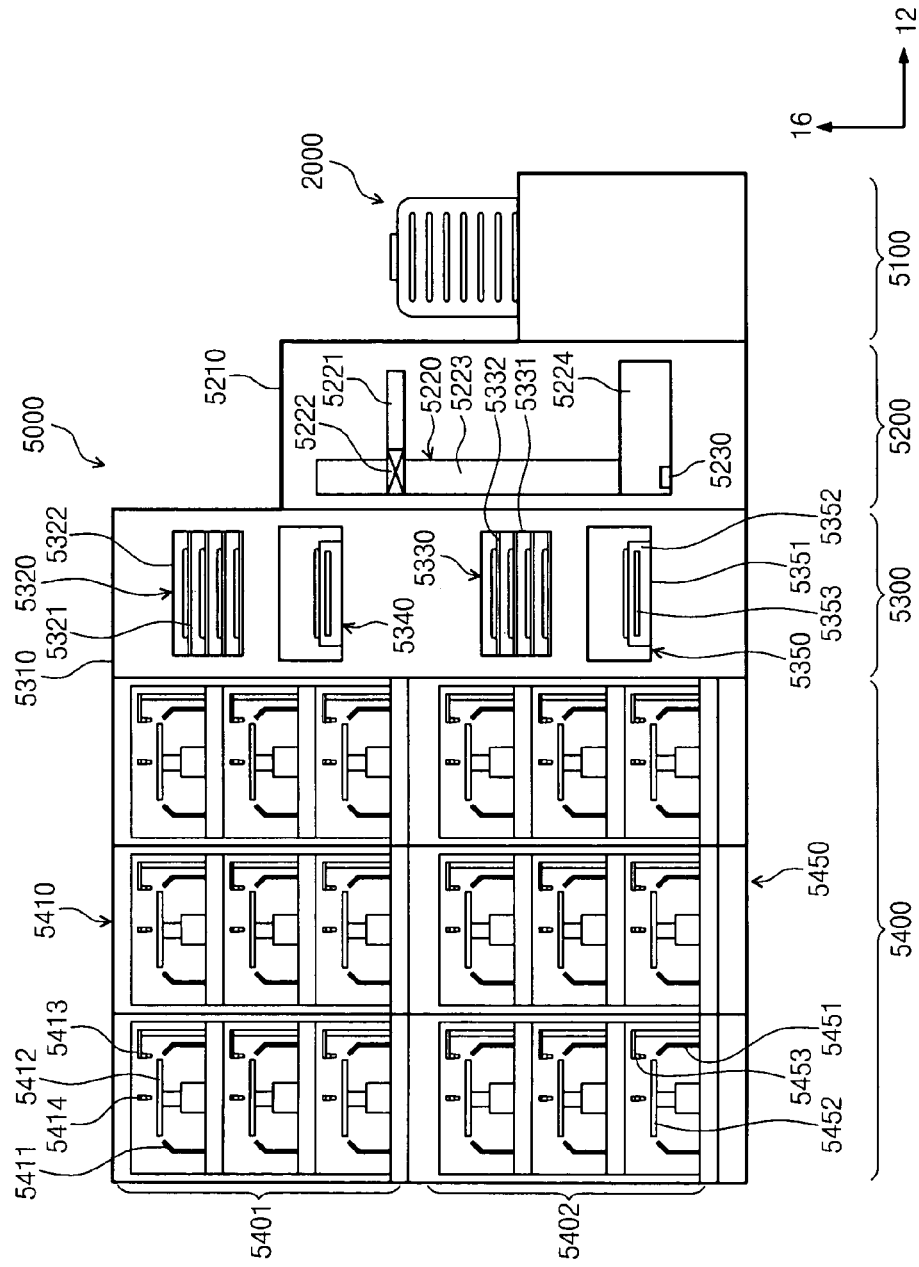
Figure 12:
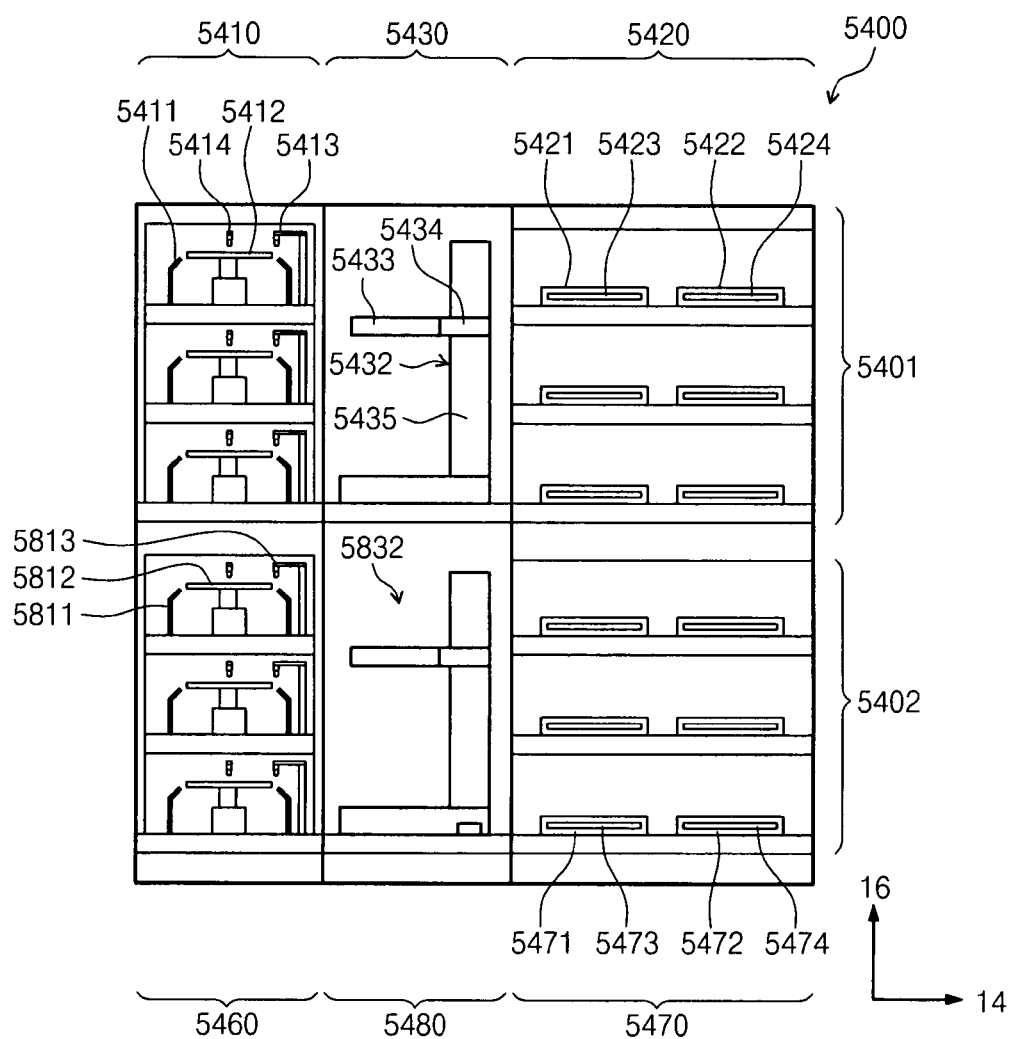

FIGS. 10 to 12 are schematic views of the developing unit 5000. That is, FIG. 10 is a view of the developing unit 5000 when viewed from above, FIG. 11 is a view of the developing unit 5000 when viewed in a direction "E," and FIG. 12 is a view of the developing unit 5000 when viewed in a direction F."

Referring to FIGS. 10 to 12, the developing unit 5000 includes a load port 5100, an index module 5200, a buffer module 5300, and a process module 5400. The load port 5100, index module 5200, buffer module 5300, and process module 5400 are sequentially arranged in the first direction 12. The load port 5100 has a load table 5120 on which the container 2000 receiving the wafers W is disposed. A plurality of the load tables 5120 are provided and arranged in a line extending in the second direction 14. In FIG. 10, four load tables 5120 are provided.

The index module 5200 transfers the wafer W between the container 2000 on the load table and the buffer module 5300. The index module 5200 includes a frame 5210, an index robot 5220, and a guide rail 5230. The frame 5210 is formed in an empty rectangular parallelepiped shape and disposed between the load port 5100 and the buffer module 5300. The frame 5210 may be provided to be lower than a frame 5310 of the buffer module 5300, which will be described later. The index robot 5220 and the guide rail 5230 are disposed within the frame 5210. The index robot 5220 has a 4-shaft driving structure such that a hand 5221 directly handling the wafer W can rotate and move in the first, second, and third directions 12, 14, and 16. The index robot 5220 includes an arm 5222, a support 5223, and a base 5224 in addition to the hand 5221. The arm 5222 is provided to be expandable and contractible so that the hand 5222 can be movable in the horizontal direction. The support 5223 is disposed such that a length direction thereof extends in the third direction 16. The arm 5222 is coupled to the support 5223 to be movable along the support 5223. The guide rail 5230 is provided such that a length direction thereof extends in the second direction 14. The support 5223 is fixedly coupled to the base 5224. The base 5224 is coupled to the guide rail 5230 to be linearly movable along the guide rail 5230. Although not shown in the drawings, the frame 5210 is provided with a door opener for opening and closing the door of the container 2000.

Referring to FIG. 11, the buffer module 5300 includes a frame 5310, a first buffer 5320, a second buffer 5330, a first cooling chamber 5340, a second cooling chamber 5350, and a buffer robot 5360. The frame 5310 is formed in an empty rectangular parallelepiped shape. The frame 5310 is disposed between the index module 5200 and the process module 5400. The first buffer 5320, second buffer 5330, first cooling chamber 5340, second cooling chamber 5350, and buffer robot 5360 are disposed in the frame 5310. The second cooling chamber 5350, second buffer 5330, first cooling chamber 5340, and first buffer 5320 are sequentially arranged upward in the third direction 16. The first cooling chamber 5340 and the first buffer 5320 are located at the same height as a first module 5401 of the process module 5400, which will be described later. The second cooling chamber 5350 and the second buffer 5330 are located at the same height as a second module 5402 of the process module 5400, which will be described later. The buffer robot 5360 is located to be spaced apart from the second buffer 5330, second cooling chamber 5350, first buffer 5320, and first cooling chamber 5340 in the second direction 14 by a predetermined distance.

Each of the first and second buffers 5320 and 5330 temporarily stores a plurality of the wafers W. The second buffer 5330 includes a housing 5331 and a plurality of supports 5332. The supports 5332 are disposed in the housing 5331 and spaced apart from each other in the third direction 16. One wafer W is disposed on each of the supports 5332. The housing 5331 is provided with openings (not shown) corresponding to the index robot 5220, buffer robot 5360, and second robot 5482 such that the index robot 5220, buffer robot 5360, and a second robot 5482 of the second module 5402, which will be described later, can carry or take the wafer to or from the support 5332. The first buffer 5320 has a similar structure to the second buffer 5330. However, the housing 5321 of the first buffer 5320 is provided with openings corresponding to the buffer robot 5360 and a first robot 5432 on the first module 5401, which will be described later. The number of the supports 5322 of the first buffer 5320 may be same as or different from the number of the supports 5332 of the second buffer 5330. For instant, the number of the supports 5332 of the second buffer 5330 may be greater than the number of the supports 5322 of the first buffer 5320.

The buffer robot 5360 transfers the wafer W between the first and second buffers 5320 and 5330. The buffer robot 5360 includes a hand 5361, an arm 5362, and a support 5363. The hand 5361 is fixedly installed on the arm 5362. The arm 5362 is configured to be capable of expanding and contracting so that the hand 5361 can move in the second direction 14. The arm 5362 is coupled to the support 5363 to be linearly movable along the support 5363 in the third direction 16. The support 5363 has a length extending from a location corresponding to the second buffer 5330 to a location corresponding to the first buffer 5320. The support 5363 may further extend over the location corresponding to the second buffer 5330 or the location corresponding to the first buffer 5320. The buffer robot 5360 may be configured to have a 2-shaft driving structure such that the hand 5361 moves only in the second and third directions 14 and 16.

The first and second cooling chambers 5340 and 5350 cool the wafer W. The first cooling chamber 5340 has the same structure as the second cooling chamber 5350. The second cooling chamber 5350 has a housing 5351 and a cooling plate 5352. The cooling plate 5352 has a top surface on which the wafer W is disposed and a cooling unit 5353 cooling the wafer W. The cooling element 5353 may be formed of a variety of elements such as cooling water, a thermoelectric module, and the like. In addition, the second cooling chamber 5350 may be provided with a lift pin assembly (not shown) locating the wafer W on the cooling plate 5352. The housing 5351 is provided with openings (not shown) corresponding to the index robot 5220 and the second robot 5482 so that the index robot 5220 and a second robot 5482 of the second module 5402, which will be described later, can carry or take the wafer W onto or from the cooling plate 5352. In addition, the second cooling chamber 5350 may be provided with doors (not shown) for opening and closing the openings.

The process module 5400 performs a process required before the wafer W is transferred to the pre/post-exposure treatment unit 4000. The process module is generally formed in a rectangular parallelepiped shape. The process module 5400 includes a first module 5401 and a second module 5402. The first and second modules 5401 and 5402 are arranged at different layers. The first and second modules 5401 and 5402 may be provided to perform a same process. For example, the first module 5401 is located above the second module 5402.

The first module 3401 includes a developing chamber 5410, a bake chamber 5420, and a return chamber 5430. The developing chamber 5410, bake chamber 5420, and return chamber 5430 are sequentially arranged in the second direction 14. Therefore, the developing chamber 5410 and the bake chamber 5420 are spaced apart from each other in the second direction 14 with the return chamber 5430 interposed therebetween. A plurality of the developing chambers 5410 are arranged in each of the first and third directions 12 and 16. In the drawings, six developing chambers 5410 are exemplarily provided. A plurality of the bake chambers 5420 are arranged in each of the first and third directions 12 and 16. In the drawings, six bake chambers 5420 are exemplarily provided. However, six or more bake chambers 5420 may be provided.

The return chambers 5430 are located side by side with the first buffer 5320 of the buffer module 5300 in the first direction 12. The first robot 5432 and the guide rail 5433 are disposed in the return chamber 5430. The return chamber 5430 is generally formed in a rectangular shape. The first robot 5432 transfers the wafer W between the bake chambers 5320, developing chambers 5400, first buffer 5320, and first cooling chamber 5340. The guide rail 5433 has a length direction extending in the first direction 12. The guide rail 5433 guides the linear movement of the first robot 5432 in the first direction 12. The robot 5432 has a hand 5434, an arm 5453, a support 5436, and a base 5437. The hand 5434 is fixedly installed on the arm 5435. The arm 5435 is configured to be capable of expanding and contracting so that the hand 5434 can move in the horizontal direction. The support 5436 is disposed such that a length direction thereof extends in the third direction 16. The arm 5435 is coupled to the support 5436 to be capable of linearly moving along the support 5436 in the third direction 16. The support 5436 is fixedly coupled to the base 5437 and the base 5437 is coupled to the guide rail 5433 to be capable of moving along the guide rail 5433.

All of the developing chambers 5410 have the same structure. However, types of the developing solution used in the developing chamber 5410 may be different from each other. The developing chamber 5410 removes a portion of the photoresist, which is exposed to the light. At this point, a portion of the protective layer, which is exposed to the light, is also removed together. Selectively, portions of the photoresist and protective layer, which are not exposed to the light, may be removed depending on the type of the developing solutions used.

The developing chamber 5410 includes a housing 5411, a support plate 5412, and a nozzle 5413. The housing 5411 is formed in a cup shape having an opened top. The supporting plate 5412 is located in the housing 3411 to support the wafer W. The supporting plate 3412 is configured to be capable of rotating. The nozzle 5413 supplies the developing solution onto the wafer W on the supporting plate 5412. The nozzle 5412 is formed in a circular tube shape to supply the developing solution to a center of the wafer W. Alternatively, the nozzle 5412 may have a length corresponding to a diameter of the wafer W and have a slit-type outlet. In addition, the developing chamber 5410 may further include a nozzle 5414 for supplying cleaning liquid such as deionized water for cleaning a surface of the wafer W on which the photoresist is coated.

The bake chambers 5420 heat-treat the wafer W. For example, the bake chambers 3420 perform a post-bake process for heating the wafer W before the developing process, a hard bake process for heating the wafer W after the developing process, and cooling processes performed after the respective bake processes. The bake chamber 5420 includes a cooling plate 5421 or a heating plate 5422. The cooling plate 5421 is provided with a cooling element 5423 such as cooling water or thermoelectric module. The heating plate 5422 is provided with a heating element 5424 such as a heating wire or a thermoelectric module. The heating plate 5422 and the cooling plate 5421 may be provided in the respective bake chambers 5420. Alternatively, some of the bake chambers 5420 may be provided with only the heating plate 5422 and the rest may be provided with only the cooling plate 5421.

The second module 5402 includes a developing chamber 5460, a bake chamber 5470, and a return chamber 5480. The developing chamber 5460, bake chamber 5470, and return chamber 5480 have same structures and arrangements as the developing chamber 5410, bake chamber 5420, and return chamber 5430 of the first module 5401. In addition, the return chamber 5480 has a second robot 5482 having the same structure as the first robot 3432 of the first module 3401. The second robot 5482 is configured to transfer the wafer W between the developing chamber 5460, bake chamber 5470, second buffer 5330, and second cooling chamber 5350.

In the above-described process module 3400, the first and second modules 3401 and 3402 are separated from each other. In addition, when viewed from above, the first module 3401 has the same structure and arrangement as the second module.

Figure 13A:
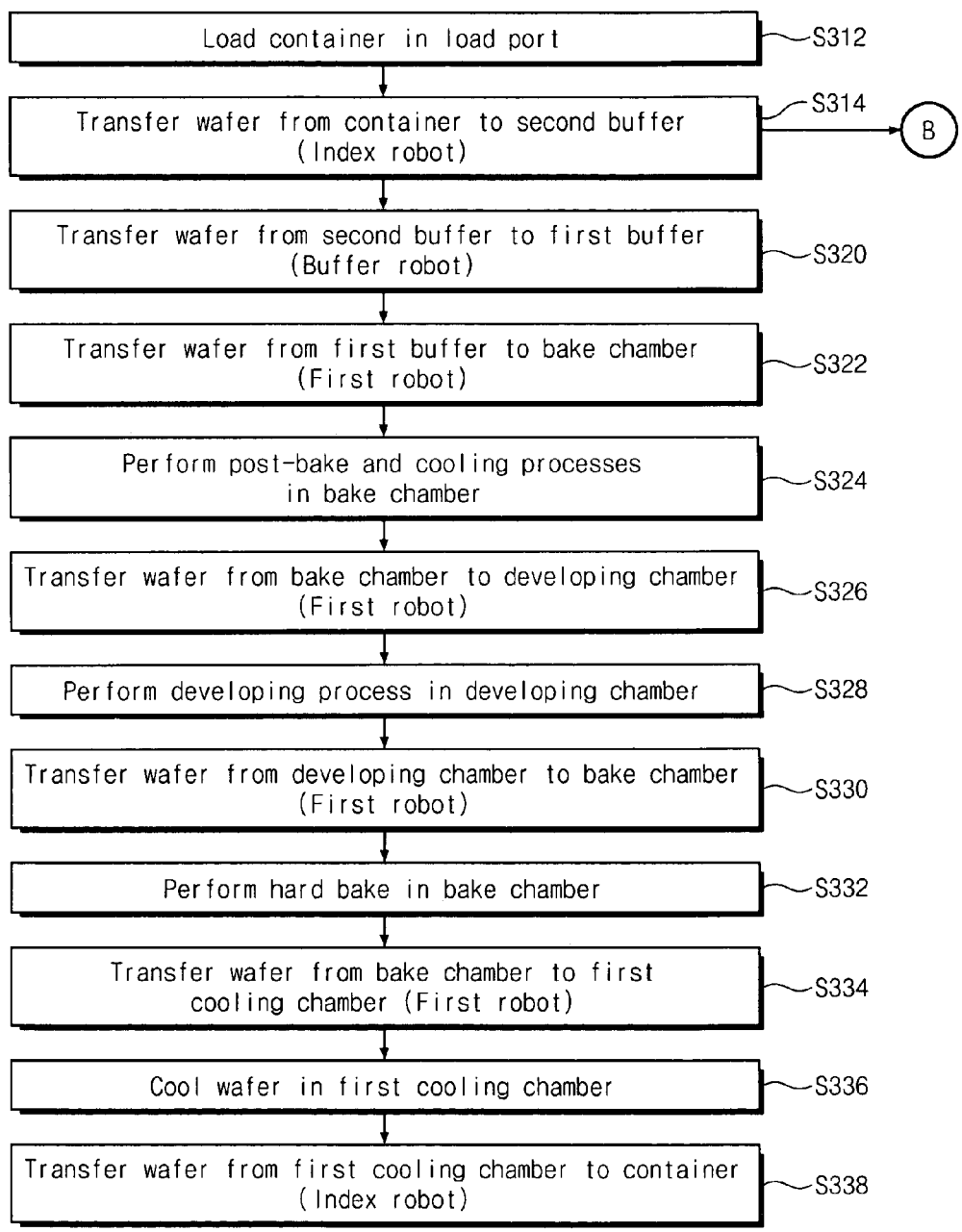
FIGS. 13a to 13b are flowcharts illustrating sequential processes performed in the developing unit of FIG. 10, and FIGS. 14a to 14g are views illustrating sequential processes for forming a pattern on a wafer.
Figure 13B:
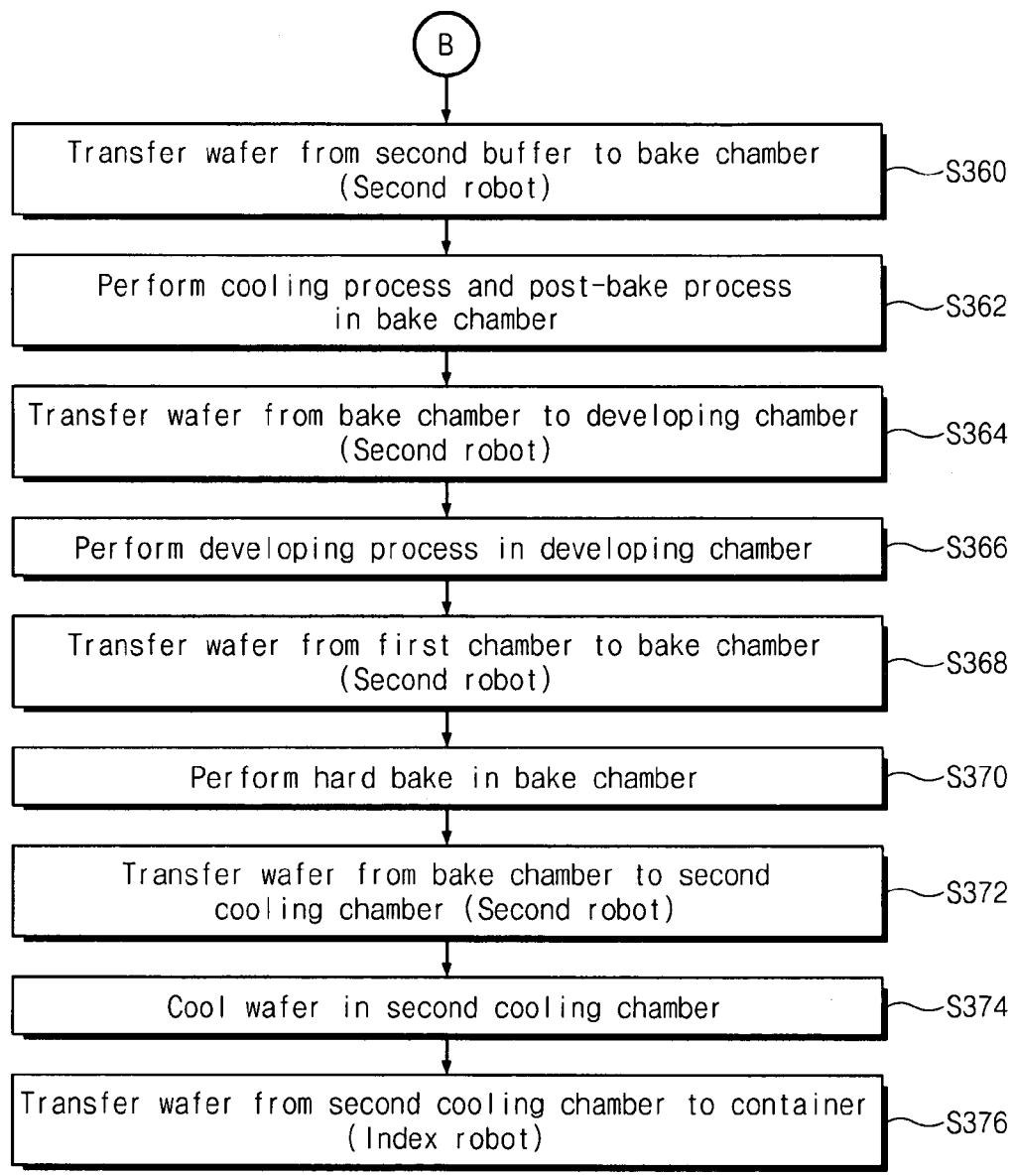

The following will describe a process by the developing unit 5000 of FIG. 10 with reference to FIGS. 13a and 13b.

FIGS. 13a and 13b are flowcharts illustrating a process for the wafer W by the developing unit 5000 according to one embodiment.

The container 2000 receiving the wafers W is disposed on the load table 5120 of the load port 5100 (S312). The door of the container 2000 is opened by the door opener. The index robot 5220 takes out the wafer W from the container 2000 and carries the same to the second buffer 5330 (S314). The wafer W is transferred to one of the first and second modules 5401 and 5402.

When it is selected that the wafer W is processed in the first module 5401, the buffer robot 5360 carries the wafer W stored in the second buffer 5330 to the first buffer 5320 (S320). The first robot 5432 takes out the wafer W from the first buffer 5320 and carries the same to the bake chamber 5420 (S322). The bake chamber 5420 performs sequentially the post-bake process and the cooling process (S324). The first robot 5432 takes out the wafer W from the bake chamber 5420 and carries the same to the developing chamber 3410 (S326). The developing chamber 5410 coats the developing solution onto the wafer W (S328). Next, the first robot 5423 carries the wafer W from the developing chamber 5410 to the bake chamber 5420 (S330). The bake chamber 5420 performs the hard bake process for the wafer W (S332).

The first robot 5432 takes out the wafer from the bake chamber 5420 and carries the same to the first cooling chamber 5430 (S334). The first cooling chamber 5430 performs a process for cooling the wafer W (S336). The index robot 5220 takes out the wafer from the first cooling chamber 5340 and carries the same to the container 2000 (S338).

When it is selected that the wafer W is processed in the second module 5402, the second robot 5482 takes out the wafer W from the second buffer 5330 and carries the same to the bake chamber 5470 of the second module 5402 (S360). The bake chamber 5470 sequentially performs the post-bake process and the cooling process (S362). The second robot 5482 takes out the wafer W from the bake chamber 5470 and carries the same to the developing chamber 5460 (S364). The developing solution is coated onto the wafer W in the developing chamber 5460 (S366). Next, the second robot 5482 carries the wafer W from the developing chamber 5460 to the bake chamber 5470 (S368). The bake chamber 5470 performs the hard bake process for the wafer W (S370).

The second robot 5482 takes out the wafer W from the bake chamber 5470 and carries the same to the second cooling chamber 5350 (S372). The second cooling chamber 5350 performs the cooling process for the wafer W (S374). The index robot 5220 carries the wafer W from the second cooling chamber 5350 to the container 2000 (S376).

The following will describe a variety of modified examples of the developing unit 5000.

The process module 5400 may include only one module instead of the first and second modules 5401 and 5402 that are disposed at different layers.

In addition, a plurality of first cooling chambers 5340 and a plurality of second cooling chambers 5350 are stacked one another in the index module 5200.

In addition, the first and second cooling chambers 5340 and 5350 may not be provided in the buffer module 5300. In this case, the wafer W may be directly transferred from the first module 5401 to the first buffer 5320 by the first robot 5432 and the index robot 5220 may carry the wafers W stored in the first buffer 5320 to the container 2000. In addition, the wafer W may be directly transferred from the second module 5402 to the second buffer 5330 by the second robot 5482 and the index robot 5220 may carry the wafers W stored in the second buffer 5330 to the container 2000.

Further, the locations of the first buffer 5320 and the first cooling chamber 5340 may be exchanged in the buffer module 5300. The locations of the second buffer 5330 and the second cooling chamber 5350 may be also exchanged in the buffer module 5300.

In addition, the buffer module 5300 may have the same height as the process module 5400. In this case, the index robot 5220 may directly carry the wafers W to the first buffer 5320.

Further, additional processes other than the above-described processes may be further performed in the process module 5400.

According to the embodiment of FIG. 1, the substrate treatment apparatus is designed such that the process for performing the coating process, the unit for performing the developing process, and the unit that is connected inline with the exposure unit 9000 to perform the pre/post-exposure treatment process are independently provided. Accordingly, unlike the apparatus in which a module for simultaneously performing the coating and developing processes are provided inline with the exposure unit 9000, the coating and developing units 3000 and 5000 of the substrate treatment system of the embodiment of FIG. 1 can continuously perform their processes even when it takes a long time to perform the process in the exposure unit 900 and thus the wafers W are congested.

Figure 14A:
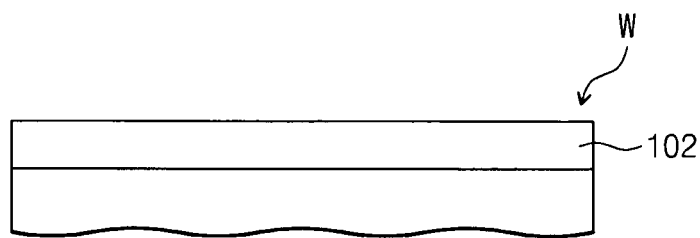
Figure 14B:
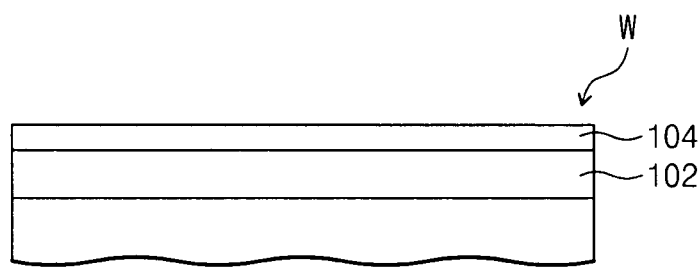
Figure 14C:
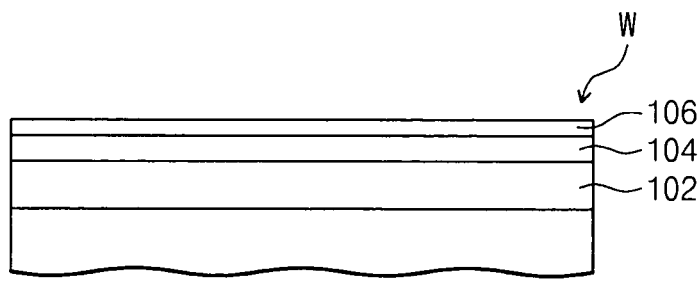
Figure 14D:
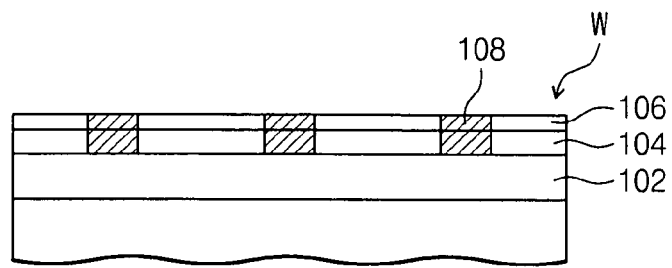
Figure 14E:
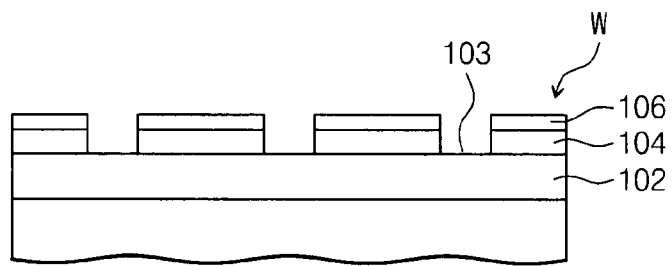
Figure 14F:
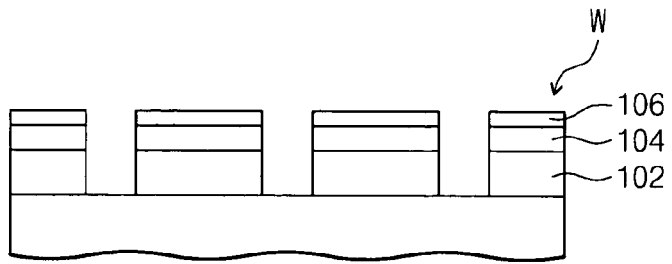
Figure 14G:
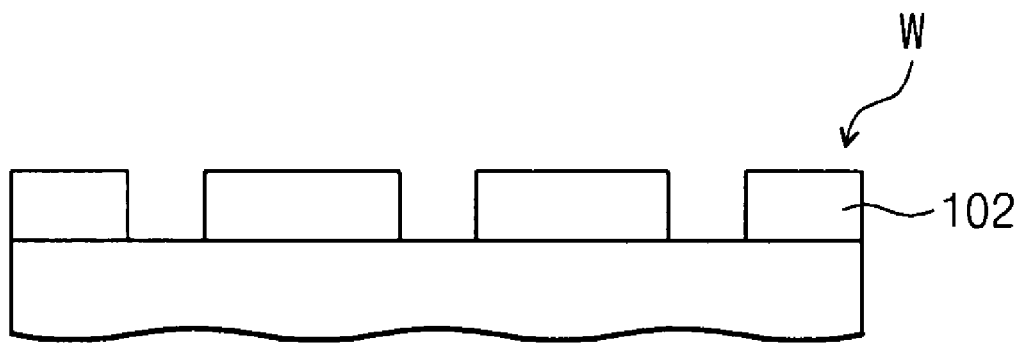

FIGS. 14a and 14g are views illustrating sequential processes for forming a pattern on a thin film formed on the wafer W.

First, a thin film 102 is deposited on the wafer W in a deposition unit (not shown) (see FIG. 14a). The wafer W is transferred to the coating unit 3000. In the coating unit 3000, a photoresist 104 is coated on the wafer W (see FIG. 14b). In the coating unit 3000, other processes such as the bake process, the edge exposure process, and the like are further processed. Next, the wafer W is transferred to the pre/post-exposure treatment unit 4000. The protective layer 106 is coated on the wafer W in the first module 4401 of the pre/post-exposure treatment unit 4000 (see FIG. 14c). As previously described, other processes such as the bake process and the like are further performed in the first module 4401. The wafer W is carried to the exposure unit 9000. The exposure unit 9000 irradiates light to a selected region 108 on the protective layer 106 and the photoresist 104 to change the property of the selected region 108 (see FIG. 14d). The second module 4402 of the pre/post-exposure treatment unit 4000 performs the cleaning process, the post-exposure bake process, and the like. The cleaning liquid remaining on the wafer W is removed during the post-exposure bake process. Next, the wafer W is transferred to the developing unit 5000. The selected region 108 of the protective layer 106 and the photoresist 104, which is changed in its property, is removed in the developing unit 5000 (see FIG. 14e). As previously described, the developing unit 5000 further performs other processes such as the bake process and the like in addition to the developing process. Next, the wafer W is transferred to the etching unit (not shown). The exposed region 103 of the thin film is removed in the etching unit (see FIG. 14f). Next, the wafer W is transferred to the ashing unit (not shown). The photoresist 104 and the protective layer 106 that remains on the thin film are removed in the ashing unit (see FIG. 14g). While the wafer is transferred between the deposition unit, coating unit 3000, pre/post-exposure treatment unit 4000, developing unit 5000, etching unit, and ashing unit, other processes such as the process for cleaning the wafer W and the like may be further performed.

According to the embodiments, the photolithography process can be efficiently performed.

In addition, the production yield in the coating unit and the developing unit can be increased.

Further, when the chemically amplified photoresist is used, the post-exposure bake process can be quickly performed.

In addition, since the cleaning liquid remaining on the substrate can be removed by amplifying acid in the post-exposure bake unit without using a separate drying nozzle in the cleaning chamber, the process time can be reduced.

Furthermore, since the protective layer is removed in the developing process and the ashing process without using a separate protective removable chamber in the pre/post-exposure treatment unit, the process time can be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system for treating a substrate, comprising:
    a coating unit performing a coating process for the substrate;
    a pre/post-exposure treatment unit connected to an exposure unit performing an exposure process and performing a pre/post-exposure treatment process for the substrate that is processed in the coating unit; and
    a developing unit performing a developing process for the substrate that is processed in the pre/post-exposure treatment unit,
    wherein each of the coating unit, pre/post-exposure treatment unit, and the developing unit comprises a load port on which a container receiving the substrates is disposed, an index module taking out or carrying the substrate from or to the container, and a process module performing a predetermined process on the substrate, wherein the load port, index module, and process module are sequentially arranged; and
    the pre/post-exposure treatment unit further comprises an interface module connected to the exposure unit, wherein the interface module is disposed at one side of the process module and the index module is disposed at the other side of the process module.

2. The system of claim 1, wherein the process module of the pre/post-exposure treatment unit includes first and second modules that are disposed at different layers.

3. The system of claim 2, wherein the first module comprises:
    a protective layer coating chamber coating a protective layer on the substrate;
    a bake chamber performing a heat treatment for the substrate; and
    a first robot transferring the substrate between the protective layer coating chamber and the bake chamber.

4. The system of claim 3, wherein the second module further comprises a cleaning chamber cleaning the substrate.

5. The system of claim 4, wherein the second module comprises:
    a post-exposure bake chamber performing a post-exposure bake chamber for the substrate that is exposed; and
    a second robot transferring the substrate between the cleaning chamber and the post-exposure bake chamber.

6. The system of claim 2, wherein the pre/post-exposure treatment unit further comprises a buffer module disposed between the index module and the process module, wherein the buffer module comprises:
    a first buffer disposed at a height corresponding to the first module and temporarily storing the substrate; and
    a second buffer disposed at a height corresponding to the second module and temporarily storing the substrate.

7. The system of claim 6, wherein the first and second buffers are stacked one another, and each of the first and second buffers comprises a plurality of supports.

8. The system of claim 7, wherein the buffer module of the pre/post-exposure treatment unit further comprises a buffer robot transferring the substrate between the first and second buffers.

9. The system of claim 8, wherein the first and second buffers are arranged side by side in a vertical direction.

10. The system of claim 6, wherein the buffer module is disposed at a height corresponding to the first module and further comprises a cooling chamber cooling the substrate.

11. The system of claim 2, wherein the interface module comprises:
    a first buffer disposed at a height corresponding to the first module and temporarily storing the substrate;
    a second buffer disposed at a height corresponding to the second module and temporarily storing the substrate; and
    an interface robot transferring the substrate between the exposure unit and the second buffer and between the second buffer and the exposure unit.

12. The system of claim 1, wherein the coating unit further comprises an edge exposure module, wherein the edge exposure module is disposed at one side of the process module and the index module is disposed at the other side of the process module.

* * * * *